(12) United States Patent
Harada et al.

(10) Patent No.: US 12,396,090 B2
(45) Date of Patent: Aug. 19, 2025

(54) RADIO-FREQUENCY MODULE AND COMMUNICATION DEVICE

(71) Applicant: Murata Manufacturing Co., Ltd., Kyoto (JP)

(72) Inventors: Tetsuro Harada, Kyoto (JP); Dai Nakagawa, Kyoto (JP); Yuji Takematsu, Kyoto (JP); Hiroaki Takaoka, Kyoto (JP); Takahisa Toyomura, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 319 days.

(21) Appl. No.: 18/332,251

(22) Filed: Jun. 9, 2023

(65) Prior Publication Data

US 2023/0319984 A1 Oct. 5, 2023

Related U.S. Application Data

(63) Continuation of application No. PCT/JP2021/036218, filed on Sep. 30, 2021.

(30) Foreign Application Priority Data

Dec. 25, 2020 (JP) .................................. 2020-217807

(51) Int. Cl.
*H05K 1/02* (2006.01)

(52) U.S. Cl.
CPC ... *H05K 1/0243* (2013.01); *H05K 2201/1003* (2013.01); *H05K 2201/10098* (2013.01)

(58) Field of Classification Search
CPC ......... H05K 1/0243; H05K 2201/1003; H05K 2201/10098

(Continued)

(56) References Cited

U.S. PATENT DOCUMENTS

2003/0143971 A1 7/2003 Hongo et al.
2008/0212552 A1 9/2008 Fukamachi et al.

(Continued)

FOREIGN PATENT DOCUMENTS

JP 2002-076267 A 3/2002
JP 2009-124746 A 6/2009

(Continued)

OTHER PUBLICATIONS

International Search Report for PCT/JP2021/036218 dated Dec. 28, 2021.

*Primary Examiner* — Binh B Tran
(74) *Attorney, Agent, or Firm* — McDonald Hopkins LLC

(57) ABSTRACT

Detection accuracy is improved with a reduced size. A radio-frequency module includes an antenna terminal, a signal input terminal, a signal output terminal, a mounting substrate, a chip inductor, and a directional coupler. The mounting substrate has a first major surface and a second major surface opposite to each other. The chip inductor is mounted on the first major surface of the mounting substrate. The chip inductor is provided in at least one of a transmitting path between the antenna terminal and the signal input terminal and a receiving path between the antenna terminal and the signal output terminal. The directional coupler is mounted on the second major surface of the mounting substrate, and at least part of the directional coupler is provided in the transmitting path.

12 Claims, 8 Drawing Sheets

(58) Field of Classification Search
USPC .......................................................... 361/782
See application file for complete search history.

(56) References Cited

U.S. PATENT DOCUMENTS

| | | | |
|---|---|---|---|
| 2019/0014655 A1* | 1/2019 | Yazaki | H05K 1/181 |
| 2020/0051941 A1 | 2/2020 | Nakazawa et al. | |
| 2020/0091608 A1* | 3/2020 | Alpman | H03L 7/145 |
| 2021/0152202 A1 | 5/2021 | Uejima | |
| 2021/0234247 A1 | 7/2021 | Tokuda et al. | |

FOREIGN PATENT DOCUMENTS

| | | |
|---|---|---|
| JP | 2020-027974 A | 2/2020 |
| WO | 2019/240096 A1 | 12/2019 |
| WO | 2020/129892 A1 | 6/2020 |

\* cited by examiner

RADIO-FREQUENCY MODULE AND COMMUNICATION DEVICE

CROSS REFERENCE TO RELATED APPLICATION

This is a continuation of International Application No. PCT/JP2021/036218 filed on Sep. 30, 2021 which claims priority from Japanese Patent Application No. 2020-217807 filed on Dec. 25, 2020. The contents of these applications are incorporated herein by reference in their entireties.

BACKGROUND ART

Technical Field

The present disclosure generally relates to a radio-frequency module and a communication device and, more specifically, to a radio-frequency module that includes a mounting substrate, and a communication device that includes the radio-frequency module.

Patent Document 1 describes a coupler module (radio-frequency module) that includes a module substrate (mounting substrate), a first component, and a second component. The first component has a directional coupler that includes a main line and an auxiliary line. The second component is, for example, an LC resonant filter that is made up of a capacitor and an inductor and that processes a signal passing through the main line or the auxiliary line. The first component and the second component are mounted adjacent to each other on the same major surface of the module substrate.

Patent Document 1: International Publication No. 2020/129892

BRIEF SUMMARY

In the coupler module described in Patent Document 1, the first component and the second component are adjacent to each other on the same major surface of the module substrate, so the detection accuracy may decrease due to interference of a signal or jump of a signal. In addition, in the coupler module described in Patent Document 1, there are a large number of components mounted on the same major surface of the module substrate, so the size may increase.

The present disclosure provides a radio-frequency module and a communication device that can be reduced in size and that are capable of suppressing a decrease in detection accuracy.

A radio-frequency module according to an aspect of the present disclosure includes an antenna terminal, a signal input terminal, a signal output terminal, a mounting substrate, a chip inductor, and a directional coupler. A transmitting signal is input to the signal input terminal. A receiving signal is output from the signal output terminal. The mounting substrate has a first major surface and a second major surface opposite to each other. The chip inductor is mounted on the first major surface of the mounting substrate and provided in at least one of a transmitting path between the antenna terminal and the signal input terminal and a receiving path between the antenna terminal and the signal output terminal. The directional coupler is mounted on the second major surface of the mounting substrate, and at least part of the directional coupler is provided in the transmitting path.

A communication device according to an aspect of the present disclosure includes the radio-frequency module and a signal processing circuit. The signal processing circuit is connected to the radio-frequency module.

With the radio-frequency module and the communication device according to the aspects of the present disclosure, it is possible to reduce the size and to suppress a decrease in detection accuracy.

DETAILED DESCRIPTION

Figure 1:
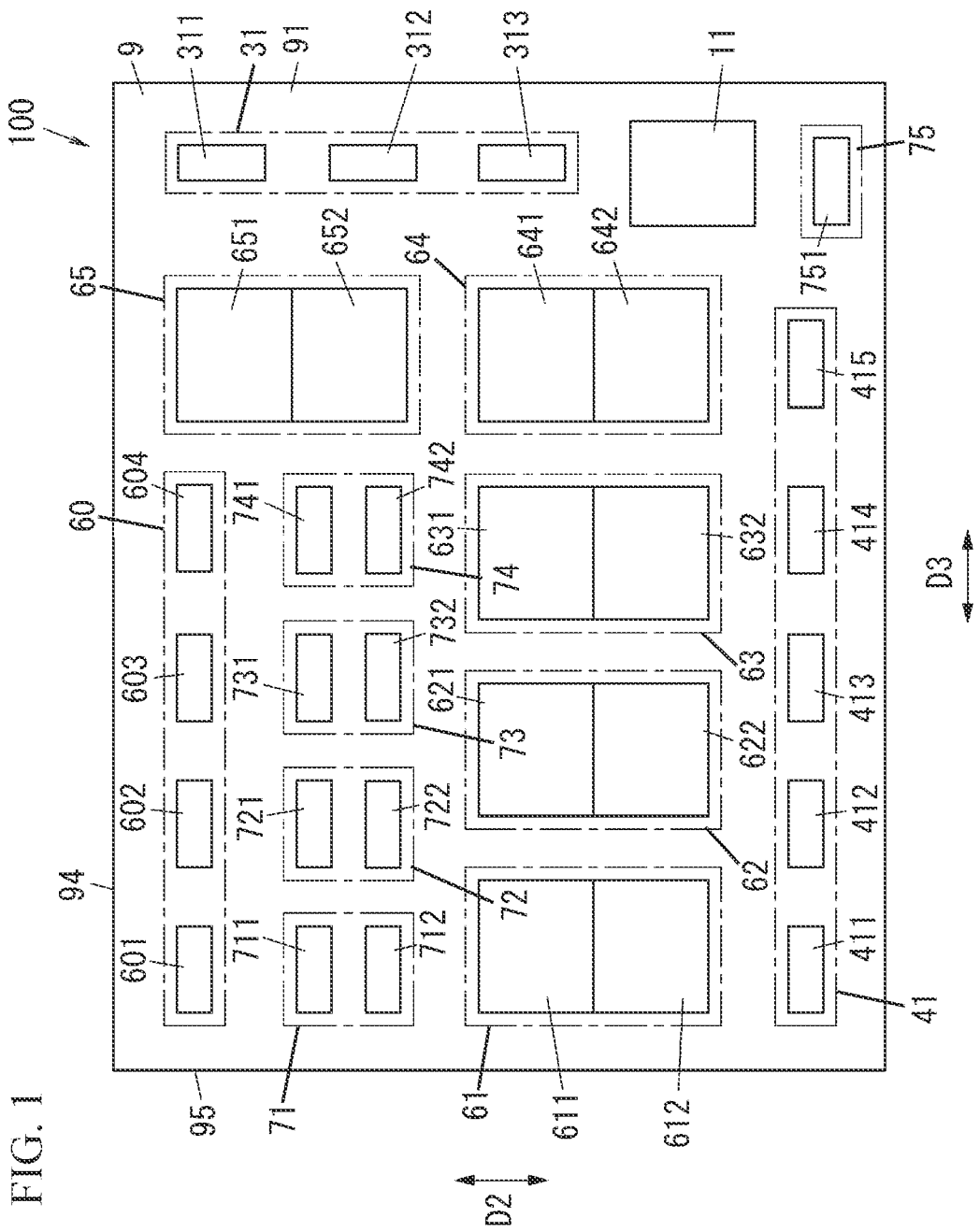
FIG. 1 is a plan view that relates to a radio-frequency module according to a first embodiment and from which a shield layer and a resin layer are omitted.

FIGS. 1 to 3, and 6 that will be referenced in the following embodiments and the like all are schematic diagrams, and the ratios of the sizes and thicknesses of component elements in the drawings do not always reflect actual scale ratios.

First Embodiment

A radio-frequency module 100 according to a first embodiment includes an antenna terminal 81, signal input terminals 82, 83, signal output terminals 84, 85, a mounting substrate 9, a chip inductor 601, and a directional coupler 80, as shown in FIGS. 1 to 4. The signal input terminals 82, 83 are terminals to which a transmitting signal is input. The signal output terminals 84, 85 are terminals from which a receiving signal is output. The mounting substrate 9 has a first major surface 91 and a second major surface 92 opposite to each other. The chip inductor 601 is disposed on the first major surface 91 of the mounting substrate 9. The chip inductor 601 is provided in at least one of a transmitting path T1 and a receiving path R1. The transmitting path T1 is a path between the antenna terminal 81 and the signal input terminals 82, 83. The receiving path R1 is a path between the antenna terminal 81 and the signal output terminals 84, 85. The directional coupler 80 is mounted on the second major surface 92 of the mounting substrate 9, and at least part (main line 801) of the directional coupler 80 is provided in the transmitting path T1.

In the radio-frequency module 100 according to the first embodiment, as described above, the chip inductor 601 is mounted on the first major surface 91 of the mounting substrate 9, and the directional coupler 80 is mounted on the second major surface 92 of the mounting substrate 9. Thus, in comparison with the case where both a chip inductor and a directional coupler are mounted on a first major surface of a mounting substrate, it is possible to reduce the size in a direction that intersects with a thickness direction D1 of the mounting substrate 9. In the radio-frequency module 100 according to the first embodiment, it is possible to suppress jump of a signal between the chip inductor 601 and the directional coupler 80, with the result that it is possible to suppress a decrease in detection accuracy. In other words, with the radio-frequency module 100 according to the first embodiment, it is possible to reduce the size and to suppress a decrease in detection accuracy.

Hereinafter, the radio-frequency module 100 and a communication device 300 according to the first embodiment will be described in more detail with reference to FIGS. 1 to 5.

(1) Radio-Frequency Module and Communication Device (1.1) Circuit Configuration of Radio-Frequency Module and Communication Device Initially, the circuit configuration of the radio-frequency module 100 and the communication device 300 according to the first embodiment will be described with reference to FIG. 4.

The radio-frequency module 100 is used in, for example, the communication device 300. The communication device 300 is, for example, a mobile phone (for example, a smartphone); however, the communication device 300 is not limited to a mobile phone. The communication device 300 may be, for example, a wearable terminal (for example, a smart watch). The radio-frequency module 100 is, for example, a module that supports a fourth generation mobile communication (4G) standard, a fifth generation mobile communication (5G) standard, and the like. The 4G standard is, for example, a third generation partnership project (3GPP) long term evolution (LTE) standard. The 5G standard is, for example, a 5G new radio (NR). The radio-frequency module 100 is a module that supports, for example, carrier aggregation and dual connectivity.

The radio-frequency module 100 supports simultaneous communication that uses a plurality of (two in the first embodiment) frequency bands (a first frequency band and a second frequency band) in uplink. The radio-frequency module 100 is configured to be capable of amplifying a transmitting signal in the first frequency band (radio-frequency signal) input from the signal processing circuit 301 with a first power amplifier 11 and outputting the transmitting signal to an antenna 310. The radio-frequency module 100 is configured to be capable of amplifying a transmitting signal in the second frequency band (radio-frequency signal) input from the signal processing circuit 301 with a second power amplifier 12 and outputting the transmitting signal to the antenna 310. The radio-frequency module 100 further includes a first low-noise amplifier 21. The radio-frequency module 100 is configured to be capable of amplifying a receiving signal in the first frequency band (radio-frequency signal) input from the antenna 310 with the first low-noise amplifier 21 and outputting the receiving signal to the signal processing circuit 301. The radio-frequency module 100 further includes a second low-noise amplifier 22. The radio-frequency module 100 is configured to be capable of amplifying a receiving signal in the second frequency band (radio-frequency signal) input from the antenna 310 with the second low-noise amplifier 22 and outputting the receiving signal to the signal processing circuit 301. The signal processing circuit 301 is not a component element of the radio-frequency module 100 but a component element of the communication device 300 that includes the radio-frequency module 100. The radio-frequency module 100 is, for example, controlled by the signal processing circuit 301 of the communication device 300. The communication device 300 includes the radio-frequency module 100 and the signal processing circuit 301. The communication device 300 further includes the antenna 310. The communication device 300 further includes a circuit board (not shown) on or in which the radio-frequency module 100 is mounted. The circuit board is, for example, a printed circuit board. The circuit board has a ground electrode to which a ground potential is applied.

The signal processing circuit 301 includes, for example, an RF signal processing circuit 302 and a baseband signal processing circuit 303. The RF signal processing circuit 302 is, for example, a radio frequency integrated circuit (RFIC). The RF signal processing circuit 302 performs signal processing on a radio-frequency signal. The RF signal processing circuit 302, for example, performs signal processing on a radio-frequency signal (transmitting signal) output from the baseband signal processing circuit 303 by up conversion or the like and outputs the processed radio-frequency signal to the radio-frequency module 100. The RF signal processing circuit 302, for example, performs signal processing on a radio-frequency signal (receiving signal) output from the radio-frequency module 100 by down conversion or the like and outputs the processed radio-frequency signal to the baseband signal processing circuit 303. The baseband signal processing circuit 303 is, for example, a baseband integrated circuit (BBIC). The baseband signal processing circuit 303 generates an I-phase signal and a Q-phase signal from a baseband signal. The baseband signal is, for example, an audio signal, an image signal, or the like input from the outside. The baseband signal processing circuit 303 performs IQ modulation process by synthesizing the I-phase signal with the Q-phase signal and outputs a transmitting signal. At this time, the transmitting signal is generated as a modulation signal (IQ signal) obtained by modulating the amplitude of a carrier wave signal with a predetermined frequency at a period longer than the period of the carrier wave signal. A receiving signal processed by the baseband signal processing circuit 303 is, for example, used to display an image as an image signal or to talk as a voice signal. The radio-frequency module 100 transmits a radio-frequency signal (a receiving signal or a transmitting signal) between the antenna 310 and the RF signal processing circuit 302 of the signal processing circuit 301.

The radio-frequency module 100 includes the first power amplifier 11, the second power amplifier 12, a first switch 51, a second switch 52, and a plurality of (for example, four) filters 61 to 64. The radio-frequency module 100 further includes a controller 20. The radio-frequency module 100 further includes a first output matching circuit 31, a second output matching circuit 32, and a plurality of (for example, four) matching circuits 71 to 74. The radio-frequency module 100 further includes the first low-noise amplifier 21, the second low-noise amplifier 22, a first input matching circuit 41, and a second input matching circuit 42. The radio-frequency module 100 further includes a third switch 53 and a fourth switch 54. The radio-frequency module 100 further includes a low pass filter 60. The radio-frequency module 100 further includes a fifth switch 55 and a sixth switch 56. The radio-frequency module 100 further includes the directional coupler 80. The radio-frequency module 100 further includes a filter 65 (see FIG. 1) and a matching circuit 75 (see FIG. 1). The filter 61 is a duplexer that includes a transmitting filter 611 and a receiving filter 612. The filter 62 is a duplexer that includes a transmitting filter 621 and a receiving filter 622. The filter 63 is a duplexer that includes a transmitting filter 631 and a receiving filter 632. The filter 64 is a duplexer that includes a transmitting filter 641 and a receiving filter 642. The filter 65 is a duplexer that includes a transmitting filter 651 and a receiving filter 652.

The radio-frequency module 100 includes a plurality of external connection terminals 8. The plurality of external connection terminals 8 includes the antenna terminal 81, the two signal input terminals 82, 83, the two signal output terminals 84, 85, and a plurality of (four) control terminals 86. The plurality of external connection terminals 8 further includes an output terminal 87, a plurality of (for example, three) input terminals 881, 882, 883, and a plurality of ground terminals 89 (see FIG. 2). FIG. 4 shows only one control terminal 86 of the four control terminals 86. The plurality of ground terminals 89 is terminals electrically connected to the ground electrode of the circuit board of the communication device 300 and applied with a ground potential. In the radio-frequency module 100 according to the first embodiment, the output terminal 87 and the plurality of input terminals 881, 882, 883 make up a plurality of signal terminals.

Hereinafter, the circuit configuration of the radio-frequency module 100 will be described in more detail with reference to FIG. 4.

The first power amplifier 11 has a first input terminal and a first output terminal. The first power amplifier 11 amplifies a transmitting signal in the first frequency band input to the first input terminal and outputs the amplified transmitting signal from the first output terminal. The first frequency band includes, for example, a transmitting band of a first communication band and a transmitting band of a second communication band. The first communication band is a communication band that corresponds to a transmitting signal that passes through the transmitting filter 611 of the filter 61. The second communication band is a communication band that corresponds to a transmitting signal that passes through the transmitting filter 621 of the filter 62.

The first input terminal of the first power amplifier 11 is connected to the signal input terminal 82. The first input terminal of the first power amplifier 11 is connected to the signal processing circuit 301 with the signal input terminal 82 interposed therebetween. The signal input terminal 82 is a terminal for inputting a radio-frequency signal (transmitting signal) from an external circuit (for example, the signal processing circuit 301) to the radio-frequency module 100. The first output terminal of the first power amplifier 11 is connected to a common terminal 510 of the first switch 51 with the first output matching circuit 31 interposed therebetween. Thus, the first output terminal of the first power amplifier 11 can be connected to any one of the filters 61, 62 with the first switch 51 interposed therebetween. The first power amplifier 11 is, for example, a multistage amplifier, an in-phase synthesis amplifier, a differential synthesis amplifier, or a Doherty amplifier.

The second power amplifier 12 has a second input terminal and a second output terminal. The second power amplifier 12 amplifies a transmitting signal in the second frequency band input to the second input terminal and outputs the amplified transmitting signal from the second output terminal. The second frequency band is a frequency band different from the first frequency band. More specifically, the second frequency band is a frequency band lower in frequency than the first frequency band. The second frequency band includes, for example, a transmitting band of a third communication band, a transmitting band of a fourth communication band, and a transmitting band of a fifth communication band. The third communication band is a communication band that corresponds to a transmitting signal that passes through the transmitting filter 631 of the filter 63. The fourth communication band is a communication band that corresponds to a transmitting signal that passes through the transmitting filter 641 of the filter 64. The fifth communication band is a communication band that corresponds to a transmitting signal that passes through the transmitting filter 651 of the filter 65.

The second input terminal of the second power amplifier 12 is connected to the signal input terminal 83. The second input terminal of the second power amplifier 12 is connected to the signal processing circuit 301 with the signal input terminal 83 interposed therebetween. The signal input terminal 83 is a terminal for inputting a radio-frequency signal (transmitting signal) from an external circuit (for example, the signal processing circuit 301) to the radio-frequency module 100. The second output terminal of the second power amplifier 12 is connected to a common terminal 520 of the second switch 52 with the second output matching circuit 32 interposed therebetween. Thus, the second output terminal of the second power amplifier 12 can be connected to any one of the filters 63, 64 with the second switch 52 interposed therebetween. The second power amplifier 12 is, for example, a multistage amplifier, an in-phase synthesis amplifier, a differential synthesis amplifier, or a Doherty amplifier.

The first switch 51 has a common terminal 510 and a plurality of (for example, two) selection terminals 511, 512. The common terminal 510 is connected to the first output terminal of the first power amplifier 11 with the first output matching circuit 31 interposed therebetween. In the first switch 51, the selection terminal 511 is connected to the input terminal of the transmitting filter 611 of the filter 61, and the selection terminal 512 is connected to the input terminal of the transmitting filter 621 of the filter 62. The first switch 51 is, for example, a switch capable of connecting at least one of the plurality of selection terminals 511, 512 to the common terminal 510. Here, the first switch 51 is, for example, a switch capable of one-to-one connection and one-to-multiple connection.

The first switch 51 is, for example, a switch integrated circuit (IC). The first switch 51 is controlled by, for example, the controller 20. In this case, the first switch 51 is controlled by the controller 20 and switches the connection status between the common terminal 510 and the plurality of selection terminals 511, 512. The first switch 51 only has to be configured to, for example, switch the connection status between the common terminal 510 and the plurality of selection terminals 511, 512 in accordance with a digital control signal input from the controller 20. The first switch 51 may be controlled by the signal processing circuit 301. In this case, the first switch 51 switches the connection status between the common terminal 510 and the plurality of selection terminals 511, 512 in accordance with a control signal from the RF signal processing circuit 302 of the signal processing circuit 301.

The second switch 52 has a common terminal 520 and a plurality of (for example, two) selection terminals 521, 522. The common terminal 520 is connected to the second output terminal of the second power amplifier 12 with the second output matching circuit 32 interposed therebetween. In the second switch 52, the selection terminal 521 is connected to the input terminal of the transmitting filter 631 of the filter 63, and the selection terminal 522 is connected to the input terminal of the transmitting filter 641 of the filter 64. The second switch 52 is, for example, a switch capable of connecting at least one of the plurality of selection terminals 521, 522 to the common terminal 520. Here, the second switch 52 is, for example, a switch capable of one-to-one connection and one-to-multiple connection.

The second switch 52 is, for example, a switch IC. The second switch 52 is controlled by, for example, the controller 20. In this case, the second switch 52 is controlled by the controller 20 and switches the connection status between the common terminal 520 and the plurality of selection terminals 521, 522. The second switch 52 only has to be configured to, for example, switch the connection status between the common terminal 520 and the plurality of selection terminals 521, 522 in accordance with a digital control signal input from the controller 20. The second switch 52 may be controlled by the signal processing circuit 301. In this case, the second switch 52 switches the connection status between the common terminal 520 and the plurality of selection terminals 521, 522 in accordance with a control signal from the RF signal processing circuit 302 of the signal processing circuit 301.

As described above, the filter 61 is a duplexer that includes the transmitting filter 611 and the receiving filter 612. The transmitting filter 611 is, for example, a band pass filter that has a transmitting band of the first communication band as a pass band. The receiving filter 612 is, for example, a band pass filter that has a receiving band of the first communication band as a pass band.

As described above, the filter 62 is a duplexer that includes the transmitting filter 621 and the receiving filter 622. The transmitting filter 621 is, for example, a band pass filter that has a transmitting band of the second communication band as a pass band. The receiving filter 622 is, for example, a band pass filter that has a receiving band of the second communication band as a pass band.

As described above, the filter 63 is a duplexer that includes the transmitting filter 631 and the receiving filter 632. The transmitting filter 631 is, for example, a band pass filter that has a transmitting band of the third communication band as a pass band. The receiving filter 632 is, for example, a band pass filter that has a receiving band of the third communication band as a pass band.

As described above, the filter 64 is a duplexer that includes the transmitting filter 641 and the receiving filter 642. The transmitting filter 641 is, for example, a band pass filter that has a transmitting band of the fourth communication band as a pass band. The receiving filter 642 is, for example, a band pass filter that has a receiving band of the fourth communication band as a pass band.

As described above, the filter 65 is a duplexer that includes the transmitting filter 651 and the receiving filter 652. The transmitting filter 651 is, for example, a band pass filter that has a transmitting band of the fifth communication band as a pass band. The receiving filter 652 is, for example, a band pass filter that has a receiving band of the fifth communication band as a pass band.

The controller 20 is connected to the first power amplifier 11 and the second power amplifier 12. The controller 20 is connected to the signal processing circuit 301 with the plurality of (for example, four) control terminals 86 interposed therebetween. FIG. 4 shows only one of the four control terminals 86. The plurality of control terminals 86 is terminals for inputting a control signal from an external circuit (for example, the signal processing circuit 301) to the controller 20. The controller 20 controls the first power amplifier 11 and the second power amplifier 12 in accordance with a control signal acquired from the plurality of control terminals 86. The controller 20 controls the first power amplifier 11 and the second power amplifier 12 in accordance with a control signal from the RF signal processing circuit 302 of the signal processing circuit 301. The controller 20 only has to be configured to, for example, control the first power amplifier 11 and the second power amplifier 12 in accordance with a digital control signal acquired from the signal processing circuit 301.

The first output matching circuit 31 is provided in a signal path between the first output terminal of the first power amplifier 11 and the common terminal 510 of the first switch 51. The first output matching circuit 31 is a circuit for matching the impedance between the first power amplifier 11 and the transmitting filters 611, 621 of the two filters 61, 62. As shown in FIG. 1, the first output matching circuit 31 is made up of, for example, two capacitors 311, 312 and one inductor 313. The first output matching circuit 31 is not limited to the above configuration and may be made up of, for example, only one inductor or only one capacitor. The first output matching circuit 31 may be configured to include, for example, a transformer.

The second output matching circuit 32 is provided in a signal path between the second output terminal of the second power amplifier 12 and the common terminal 520 of the second switch 52. The second output matching circuit 32 is a circuit for matching the impedance between the second power amplifier 12 and the transmitting filters 631, 641 of the two filters 63, 64. The second output matching circuit 32, as well as the first output matching circuit 31, is made up of, for example, two capacitors and one inductor. The second output matching circuit 32 is not limited to the above configuration and may be made up of, for example, only one inductor or only one capacitor. The second output matching circuit 32 may be configured to include, for example, a transformer.

The plurality of (for example, four) matching circuits 71 to 74 is in a one-to-one correspondence with the plurality of filters 61 to 64. The matching circuit 71 is provided in a signal path between the filter 61 and the fifth switch 55. The matching circuit 71 is a circuit for matching the impedance between the filter 61 and the fifth switch 55. As shown in FIG. 1, the matching circuit 71 is made up of, for example, one inductor 711 and one capacitor 712. The matching circuit 71 is not limited to the above configuration. For example, the matching circuit 71 may be made up of a plurality of inductors and a plurality of capacitors or may be made up of only one inductor or only one capacitor.

The matching circuit 72 is provided in a signal path between the filter 62 and the fifth switch 55. The matching circuit 72 is a circuit for matching the impedance between the filter 62 and the fifth switch 55. The matching circuit 72, as well as the matching circuit 71, is made up of, for example, one inductor and one capacitor. The matching circuit 72 is not limited to the above configuration. For example, the matching circuit 72 may be made up of a plurality of inductors and a plurality of capacitors or may be made up of only one inductor or only one capacitor.

The matching circuit 73 is provided in a signal path between the filter 63 and the fifth switch 55. The matching circuit 73 is a circuit for matching the impedance between the filter 63 and the fifth switch 55. The matching circuit 73, as well as the matching circuit 71, is made up of, for example, one inductor and one capacitor. The matching circuit 73 is not limited to the above configuration. For example, the matching circuit 73 may be made up of a plurality of inductors and a plurality of capacitors or may be made up of only one inductor or only one capacitor.

The matching circuit 74 is provided in a signal path between the filter 64 and the fifth switch 55. The matching circuit 74 is a circuit for matching the impedance between the filter 64 and the fifth switch 55. The matching circuit 74, as well as the matching circuit 71, is made up of, for example, one inductor and one capacitor. The matching circuit 74 is not limited to the above configuration. For example, the matching circuit 74 may be made up of a plurality of inductors and a plurality of capacitors or may be made up of only one inductor or only one capacitor.

The first low-noise amplifier 21 has a first input terminal and a first output terminal. The first low-noise amplifier 21 amplifies a receiving signal in the first frequency band input to the first input terminal and outputs the amplified receiving signal from the first output terminal. The first input terminal of the first low-noise amplifier 21 is connected to a common terminal 530 of the third switch 53 with the first input matching circuit 41 interposed therebetween. The first output terminal of the first low-noise amplifier 21 is connected to the signal output terminal 84. The first output terminal of the first low-noise amplifier 21 is, for example, connected to the signal processing circuit 301 with the signal output terminal 84 interposed therebetween. The signal output terminal 84 is a terminal for outputting a radio-frequency signal (receiving signal) from the first low-noise amplifier 21 to an external circuit (for example, the signal processing circuit 301).

The second low-noise amplifier 22 has a second input terminal and a second output terminal. The second low-noise amplifier 22 amplifies a receiving signal in the second frequency band input to the second input terminal and outputs the amplified receiving signal from the second output terminal. The second input terminal of the second low-noise amplifier 22 is connected to a common terminal 540 of the fourth switch 54 with the second input matching circuit 42 interposed therebetween. The second output terminal of the second low-noise amplifier 22 is connected to the signal output terminal 85. The second output terminal of the second low-noise amplifier 22 is, for example, connected to the signal processing circuit 301 with the signal output terminal 85 interposed therebetween. The signal output terminal 85 is a terminal for outputting a radio-frequency signal (receiving signal) from the second low-noise amplifier 22 to an external circuit (for example, the signal processing circuit 301).

The first input matching circuit 41 is provided in a signal path between the first input terminal of the first low-noise amplifier 21 and the common terminal 530 of the third switch 53. The first input matching circuit 41 is a circuit for matching the impedance between the first low-noise amplifier 21 and the receiving filters 612, 622 of the two filters 61, 62. As shown in FIG. 1, the first input matching circuit 41 is made up of, for example, four inductors 411 to 414 and one capacitor 415. The first input matching circuit 41 is not limited to the above configuration. For example, the first input matching circuit 41 may be made up of a plurality of inductors and a plurality of capacitors or may be made up of only one inductor or only one capacitor.

The second input matching circuit 42 is provided in a signal path between the second input terminal of the second low-noise amplifier 22 and the common terminal 540 of the fourth switch 54. The second input matching circuit 42 is a circuit for matching the impedance between the second low-noise amplifier 22 and the receiving filters 632, 642 of the two filters 63, 64. The second input matching circuit 42, as well as the first input matching circuit 41, is made up of, for example, four inductors and one capacitor. The second input matching circuit 42 is not limited to the above configuration. For example, the second input matching circuit 42 may be made up of a plurality of inductors and a plurality of capacitors or may be made up of only one inductor or only one capacitor.

The third switch 53 has the common terminal 530 and the plurality of (for example, two) selection terminals 531, 532. The common terminal 530 is connected to the first input terminal of the first low-noise amplifier 21 with the first input matching circuit 41 interposed therebetween. In the third switch 53, the selection terminal 531 is connected to the output terminal of the receiving filter 612 of the filter 61, and the selection terminal 532 is connected to the output terminal of the receiving filter 622 of the filter 62. The third switch 53 is, for example, a switch capable of connecting at least one of the plurality of selection terminals 531, 532 to the common terminal 530. Here, the third switch 53 is, for example, a switch capable of one-to-one connection and one-to-multiple connection.

The third switch 53 is, for example, a switch IC. The third switch 53 is controlled by, for example, the signal processing circuit 301. In this case, the third switch 53 switches the connection status between the common terminal 530 and the plurality of selection terminals 531, 532 in accordance with a control signal from the RF signal processing circuit 302 of the signal processing circuit 301. The third switch 53 only has to be configured to, for example, switch the connection status between the common terminal 530 and the plurality of selection terminals 531, 532 in accordance with a digital control signal input from the signal processing circuit 301. The third switch 53 may be controlled by the controller 20 instead of being controlled by the signal processing circuit 301.

The fourth switch 54 has the common terminal 540 and a plurality of (for example, two) selection terminals 541, 542. The common terminal 540 is connected to the second input terminal of the second low-noise amplifier 22 with the second input matching circuit 42 interposed therebetween. In the fourth switch 54, the selection terminal 541 is connected to the output terminal of the receiving filter 632 of the filter 63, and the selection terminal 542 is connected to the output terminal of the receiving filter 642 of the filter 64. The fourth switch 54 is, for example, a switch capable of connecting at least one of the plurality of selection terminals 541, 542 to the common terminal 540. Here, the fourth switch 54 is, for example, a switch capable of one-to-one connection and one-to-multiple connection.

The fourth switch 54 is, for example, a switch IC. The fourth switch 54 is controlled by, for example, the signal processing circuit 301. In this case, the fourth switch 54 switches the connection status between the common terminal 540 and the plurality of selection terminals 541, 542 in accordance with a control signal from the RF signal processing circuit 302 of the signal processing circuit 301. The fourth switch 54 only has to be configured to, for example, switch the connection status between the common terminal 540 and the plurality of selection terminals 541, 542 in accordance with a digital control signal input from the signal processing circuit 301. The fourth switch 54 may be controlled by the controller 20 instead of being controlled by the signal processing circuit 301.

The fifth switch 55 has a common terminal 550 and a plurality of (for example, six) selection terminals 551 to 556. The common terminal 550 is connected to the antenna terminal 81 with the low pass filter 60 and the directional coupler 80 interposed therebetween. The antenna 310 is connected to the antenna terminal 81. The selection terminal 551 is connected to a junction point between the output terminal of the transmitting filter 611 and the input terminal of the receiving filter 612 in the filter 61 with the matching circuit 71 interposed therebetween. The selection terminal 552 is connected to a junction point between the output terminal of the transmitting filter 621 and the input terminal of the receiving filter 622 in the filter 62 with the matching circuit 72 interposed therebetween. The selection terminal 554 is connected to a junction point between the output terminal of the transmitting filter 631 and the input terminal of the receiving filter 632 in the filter 63 with the matching circuit 73 interposed therebetween. The selection terminal 555 is connected to a junction point between the output terminal of the transmitting filter 641 and the input terminal of the receiving filter 642 in the filter 64 with the matching circuit 74 interposed therebetween. The selection terminals 553, 556 are not connected to any circuit. The fifth switch 55 is, for example, a switch capable of connecting at least one of the plurality of selection terminals 551 to 556 to the common terminal 550. Here, the fifth switch 55 is, for example, a switch capable of one-to-one connection and one-to-multiple connection.

The fifth switch 55 is, for example, a switch IC. The fifth switch 55 is controlled by, for example, the signal processing circuit 301. In this case, the fifth switch 55 switches the connection status between the common terminal 550 and the plurality of selection terminals 551 to 556 in accordance with a control signal from the RF signal processing circuit 302 of the signal processing circuit 301. The fifth switch 55 only has to be configured to, for example, switch the connection status between the common terminal 550 and the plurality of selection terminals 551 to 556 in accordance with a digital control signal input from the signal processing circuit 301. The fifth switch 55 may be controlled by the controller 20 instead of being controlled by the signal processing circuit 301.

The sixth switch 56 has a common terminal 560 and a plurality of (for example, five) selection terminals 561 to 565. The common terminal 560 is connected to the output terminal 87. The selection terminal 561 is connected to an auxiliary line 802 (described later) of the directional coupler 80. The selection terminal 562 is connected to an auxiliary line 803 (described later) of the directional coupler 80. The selection terminal 563 is connected to the input terminal 883 of the plurality of input terminals 881 to 883. The selection terminal 564 is connected to the input terminal 882 of the plurality of input terminals 881 to 883. The selection terminal 565 is connected to the input terminal 881 of the plurality of input terminals 881 to 883.

The sixth switch 56 is, for example, a switch IC. The sixth switch 56 is controlled by, for example, the controller 20. In this case, the sixth switch 56 is controlled by the controller 20 and switches the connection status between the common terminal 560 and the plurality of selection terminals 561 to 565. The sixth switch 56 only has to be configured to, for example, switch the connection status between the common terminal 560 and the plurality of selection terminals 561 to 565 in accordance with a digital control signal input from the controller 20. The sixth switch 56 may be controlled by the signal processing circuit 301. In this case, the sixth switch 56 switches the connection status between the common terminal 560 and the plurality of selection terminals 561 to 565 in accordance with a control signal from the RF signal processing circuit 302 of the signal processing circuit 301.

The low pass filter 60 is connected between the main line 801 (described later) of the directional coupler 80 and the common terminal 550 of the fifth switch 55. As shown in FIG. 1, the low pass filter 60 includes, for example, three inductors 601 to 603 and one capacitor 604. The low pass filter 60 may be an integrated passive device (IPD) including a plurality of inductors and a capacitor.

Figure 4:
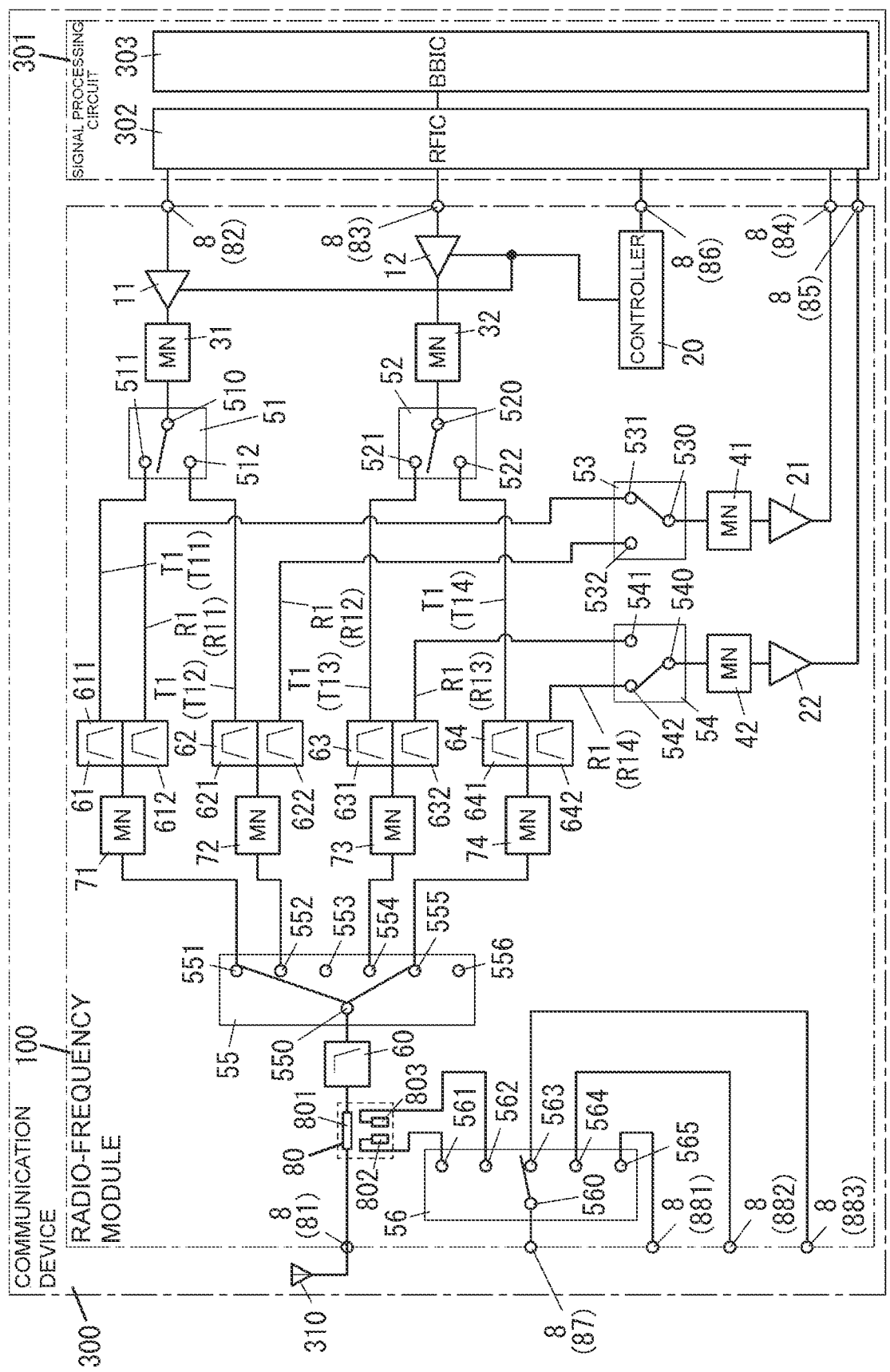
FIG. 4 is a circuit configuration diagram of a communication device that includes the radio-frequency module.

Although not shown in FIG. 4, the matching circuit 75 is provided in a signal path between the input terminal of the first power amplifier 11 and the signal input terminal 82. The matching circuit 75 is a circuit for matching the impedance between the RF signal processing circuit 302 of the signal processing circuit 301 and the first power amplifier 11. As shown in FIG. 1, the matching circuit 75 is made up of, for example, one inductor 751. The matching circuit 75 is not limited to the above configuration and may be made up of, for example, a plurality of inductors and a plurality of capacitors.

(1.2) Structure of Radio-Frequency Module

Next, the structure of the radio-frequency module 100 will be described with reference to FIGS. 1 to 3.

The radio-frequency module 100 further includes the mounting substrate 9. The mounting substrate 9 has the first major surface 91 and the second major surface 92 opposite to each other in the thickness direction D1 of the mounting substrate 9. The mounting substrate 9 is, for example, a multilayer substrate that includes a plurality of dielectric layers and a plurality of electrically conductive layers. The plurality of dielectric layers and the plurality of electrically conductive layers are laminated in the thickness direction D1 of the mounting substrate 9. Each of the plurality of electrically conductive layers is formed in a predetermined pattern determined layer by layer. Each of the plurality of electrically conductive layers includes one or more conductor pattern portions in a plane orthogonal to the thickness direction D1 of the mounting substrate 9. The material of each electrically conductive layer is, for example, copper. The plurality of electrically conductive layers includes a ground layer. In the radio-frequency module 100, the plurality of ground terminals 89 and the ground layer are electrically connected with a via conductor or the like of the mounting substrate 9, interposed therebetween. The mounting substrate 9 is, for example, a low temperature co-fired ceramics (LTCC) substrate. The mounting substrate 9 is not limited to an LTCC substrate. The mounting substrate 4 may be, for example, a printed circuit board, a high temperature co-fired ceramics (HTCC) substrate, or a resin multilayer substrate.

The mounting substrate 9 is not limited to an LTCC substrate and may be, for example, a wiring structure. The wiring structure is, for example, a multilayer structure. The multilayer structure includes at least one electrically insulating layer and at least one electrically conductive layer. The electrically insulating layer is formed in a predetermined pattern. When the number of the electrically insulating layers is multiple, each of the multiple electrically insulating layers is formed in a predetermined pattern determined layer by layer. The electrically conductive layer is formed in a predetermined pattern different from the predetermined pattern of the electrically insulating layer. When the number of the electrically conductive layers is multiple, each of the multiple electrically conductive layers is formed in a predetermined pattern determined layer by layer. The electrically conductive layer may include one or more rewiring portions. In the wiring structure, of two surfaces facing each other in the thickness direction of the multilayer structure, a first surface is the first major surface 91 of the mounting substrate 9, and a second surface is the second major surface 92 of the mounting substrate 9. The wiring structure may be, for example, an interposer. The interposer may be an interposer using a silicon substrate or may be a substrate made up of multiple layers.

The first major surface 91 and the second major surface 92 of the mounting substrate 9 are spaced apart in the thickness direction D1 of the mounting substrate 9 and intersect with the thickness direction D1 of the mounting substrate 9. The first major surface 91 of the mounting substrate 9 is, for example, orthogonal to the thickness direction D1 of the mounting substrate 9. The first major surface 91 may include, for example, the side surface or the like of the conductor pattern portion as a surface not orthogonal to the thickness direction D1. The second major surface 92 of the mounting substrate 9 is, for example, orthogonal to the thickness direction D1 of the mounting substrate 9. The first major surface 91 may include, for example, the side surface or the like of the conductor pattern portion as a surface not orthogonal to the thickness direction D1. The first major surface 91 and the second major surface 92 of the mounting substrate 9 may have minute irregularities or a recessed portion or a protruding portion. When, for example, the first major surface 91 of the mounting substrate 9 has a recessed portion, the inner surface of the recessed portion is included in the first major surface 91.

In the radio-frequency module 100 according to the first embodiment, circuit components of a first group of the plurality of circuit components are mounted on the first major surface 91 of the mounting substrate 9. The circuit components of the first group include the first power amplifier 11, the second power amplifier 12, the plurality of filters 61 to 65, the first output matching circuit 31, the second output matching circuit 32, the first input matching circuit 41, the second input matching circuit 42, the plurality of matching circuits 71 to 75, and the low pass filter 60. The phrase "the circuit components are mounted on the first major surface 91 of the mounting substrate 9" includes not only the structure that the circuit components are disposed on (mechanically connected to) the first major surface 91 of the mounting substrate 9 but also the structure that the circuit components are electrically connected to (appropriate conductor pattern portions of) the mounting substrate 9.

In the radio-frequency module 100, circuit components of a second group of the plurality of circuit components are mounted on the second major surface 92 of the mounting substrate 9. The circuit components of the second group include the first switch 51 to the sixth switch 56, the first low-noise amplifier 21, the second low-noise amplifier 22, the controller 20, and the directional coupler 80. The phrase "the circuit components are mounted on the second major surface 92 of the mounting substrate 9" includes not only the structure that the circuit components are disposed on (mechanically connected to) the second major surface 92 of the mounting substrate 9 but also the structure that the circuit components are electrically connected to (appropriate conductor pattern portions of) the mounting substrate 9.

FIG. 1 shows the first power amplifier 11, the plurality of filters 61 to 65, the first output matching circuit 31, the first input matching circuit 41, the plurality of matching circuits 71 to 75, and the low pass filter 60, of the circuit components of the first group mounted on the first major surface 91 of the mounting substrate 9. FIG. 2 shows the first low-noise amplifier 21, the first switch 51, the fifth switch 55, the sixth switch 56, the controller 20, and the directional coupler 80, of the circuit components of the second group mounted on the second major surface 92 of the mounting substrate 9. In FIG. 4, the filter 65 and the matching circuit 75 are not shown.

The first power amplifier 11 is an IC chip that includes a circuit portion having a first amplifier transistor. As shown in FIG. 1, the first power amplifier 11 is flip-chip mounted on the first major surface 91 of the mounting substrate 9. In a plan view in the thickness direction D1 of the mounting substrate 9, the outer edge of the first power amplifier 11 has a rectangular shape. The first amplifier transistor is, for example, a heterojunction bipolar transistor (HBT). In this case, the IC chip that is the first power amplifier 11 is, for example, a GaAs IC chip. The first amplifier transistor is not limited to a bipolar transistor, such as an HBT, and may be, for example, a field effect transistor (FET). The FET is, for example, a metal-oxide-semiconductor field effect transistor (MOSFET). The IC chip that is the first power amplifier 11 is not limited to a GaAs IC chip and may be, for example, an Si IC chip, an SiGe IC chip, or a GaN IC chip.

The second power amplifier 12 is an IC chip that includes a circuit portion having a second amplifier transistor. Although not shown in the drawing, the second power amplifier 12 is flip-chip mounted on the first major surface 91 of the mounting substrate 9. In a plan view in the thickness direction D1 of the mounting substrate 9, the outer edge of the second power amplifier 12 has a rectangular shape. The second amplifier transistor is, for example, an HBT. In this case, the IC chip that is the second power amplifier 12 is, for example, a GaAs IC chip. The second amplifier transistor is not limited to a bipolar transistor, such as an HBT, and may be, for example, an FET. The IC chip that is the second power amplifier 12 is not limited to a GaAs IC chip and may be, for example, an Si IC chip, an SiGe IC chip, or a GaN IC chip.

The first low-noise amplifier 21 is, for example, an IC chip that includes a substrate and a circuit portion (IC portion) formed on the substrate. As shown in FIG. 2, the first low-noise amplifier 21 is flip-chip mounted on the second major surface 92 of the mounting substrate 9. In a plan view in the thickness direction D1 of the mounting substrate 9, the outer edge of the first low-noise amplifier 21 has a rectangular shape. The substrate is, for example, a silicon substrate. The circuit portion has a function of amplifying a receiving signal input to the input terminal of the first low-noise amplifier 21.

The second low-noise amplifier 22 is, for example, an IC chip that includes a substrate and a circuit portion (IC portion) formed on the substrate. Although not shown in the drawing, the second low-noise amplifier 22 is flip-chip mounted on the second major surface 92 of the mounting substrate 9. In a plan view in the thickness direction D1 of the mounting substrate 9, the outer edge of the second low-noise amplifier 22 has a rectangular shape. The substrate is, for example, a silicon substrate. The circuit portion has a function of amplifying a receiving signal input to the input terminal of the second low-noise amplifier 22.

Each of the transmitting filter 611 and receiving filter 612 of the filter 61 is, for example, a ladder filter and has a plurality of (for example, four) series arm resonators and a plurality of (for example, three) parallel arm resonators. Each of the transmitting filter 611 and the receiving filter 612 is, for example, an acoustic wave filter. The acoustic wave filter is configured such that each of the plurality of series arm resonators and the plurality of parallel arm resonators is made up of an acoustic wave resonator. The acoustic wave filter is, for example, a surface acoustic wave filter that uses surface acoustic waves.

Each of the transmitting filter 621 and receiving filter 622 of the filter 62 is, for example, a ladder filter and has a plurality of (for example, four) series arm resonators and a plurality of (for example, three) parallel arm resonators. Each of the transmitting filter 621 and the receiving filter 622 is, for example, an acoustic wave filter. The acoustic wave filter is configured such that each of the plurality of series arm resonators and the plurality of parallel arm resonators is made up of an acoustic wave resonator. The acoustic wave filter is, for example, a surface acoustic wave filter that uses surface acoustic waves.

Each of the transmitting filter 631 and receiving filter 632 of the filter 63 is, for example, a ladder filter and has a plurality of (for example, four) series arm resonators and a plurality of (for example, three) parallel arm resonators. Each of the transmitting filter 631 and the receiving filter 632 is, for example, an acoustic wave filter. The acoustic wave filter is configured such that each of the plurality of series arm resonators and the plurality of parallel arm resonators is made up of an acoustic wave resonator. The acoustic wave filter is, for example, a surface acoustic wave filter that uses surface acoustic waves.

Each of the transmitting filter 641 and receiving filter 642 of the filter 64 is, for example, a ladder filter and has a plurality of (for example, four) series arm resonators and a plurality of (for example, three) parallel arm resonators. Each of the transmitting filter 641 and the receiving filter 642 is, for example, an acoustic wave filter. The acoustic wave filter is configured such that each of the plurality of series arm resonators and the plurality of parallel arm resonators is made up of an acoustic wave resonator. The acoustic wave filter is, for example, a surface acoustic wave filter that uses surface acoustic waves.

Each of the transmitting filter 651 and receiving filter 652 of the filter 65 is, for example, a ladder filter and has a plurality of (for example, four) series arm resonators and a plurality of (for example, three) parallel arm resonators. Each of the transmitting filter 651 and the receiving filter 652 is, for example, an acoustic wave filter. The acoustic wave filter is configured such that each of a plurality of series arm resonators and a plurality of parallel arm resonators is made up of an acoustic wave resonator. The acoustic wave filter is, for example, a surface acoustic wave filter that uses surface acoustic waves.

In the surface acoustic wave filter, each of the plurality of series arm resonators and the plurality of parallel arm resonators is, for example, a surface acoustic wave (SAW) resonator.

The surface acoustic wave filter includes, for example, a substrate and a circuit portion formed on the substrate. The substrate is, for example, a piezoelectric substrate. The piezoelectric substrate is, for example, a lithium niobate substrate, a lithium tantalate substrate, or a quartz crystal substrate. The circuit portion has a plurality of interdigital transducer electrodes in a one-to-one correspondence with a plurality of series arm resonators and a plurality of inter-digital transducer electrodes in a one-to-one correspondence with a plurality of parallel arm resonators.

As shown in FIG. 1, each of the transmitting filter 611 and receiving filter 612 of the filter 61 is mounted on the first major surface 91 of the mounting substrate 9. In a plan view in the thickness direction D1 of the mounting substrate 9, the outer edge of each of the transmitting filter 611 and receiving filter 612 of the filter 61 has a rectangular shape.

As shown in FIG. 1, each of the transmitting filter 621 and receiving filter 622 of the filter 62 is mounted on the first major surface 91 of the mounting substrate 9. In a plan view in the thickness direction D1 of the mounting substrate 9, the outer edge of each of the transmitting filter 621 and receiving filter 622 of the filter 62 has a rectangular shape.

As shown in FIG. 1, each of the transmitting filter 631 and receiving filter 632 of the filter 63 is mounted on the first major surface 91 of the mounting substrate 9. In a plan view in the thickness direction D1 of the mounting substrate 9, the outer edge of each of the transmitting filter 631 and receiving filter 632 of the filter 63 has a rectangular shape.

As shown in FIG. 1, each of the transmitting filter 641 and receiving filter 642 of the filter 64 is mounted on the first major surface 91 of the mounting substrate 9. In a plan view in the thickness direction D1 of the mounting substrate 9, the outer edge of each of the transmitting filter 641 and receiving filter 642 of the filter 64 has a rectangular shape.

As shown in FIG. 1, each of the transmitting filter 651 and receiving filter 652 of the filter 65 is mounted on the first major surface 91 of the mounting substrate 9. In a plan view in the thickness direction D1 of the mounting substrate 9, the outer edge of each of the transmitting filter 651 and receiving filter 652 of the filter 65 has a rectangular shape.

As described above, the first output matching circuit 31 includes two capacitors 311, 312 and one inductor 313. As shown in FIG. 1, each of the two capacitors 311, 312 and one inductor 313 is mounted on the first major surface 91 of the mounting substrate 9. In a plan view in the thickness direction D1 of the mounting substrate 9, the outer edge of each of the two capacitors 311, 312 and one inductor 313 has a rectangular shape. The first output matching circuit 31 may include, for example, an internal layer inductor provided in the mounting substrate 9.

As described above, the second output matching circuit 32 includes two capacitors and one inductor. Although not shown in the drawing, each of the two capacitors and one inductor is mounted on the first major surface 91 of the mounting substrate 9. In a plan view in the thickness direction D1 of the mounting substrate 9, the outer edge of each of the two capacitors and one inductor has a rectangular shape. The second output matching circuit 32 may include, for example, an internal layer inductor provided in the mounting substrate 9.

As described above, the first input matching circuit 41 includes four inductors 411 to 414 and one capacitor 415. As shown in FIG. 1, each of the four inductors 411 to 414 and one capacitor 415 is mounted on the first major surface 91 of the mounting substrate 9. In a plan view in the thickness direction D1 of the mounting substrate 9, the outer edge of each of the four inductors 411 to 414 and one capacitor 415 has a rectangular shape. The first input matching circuit 41 may include, for example, an internal layer inductor provided in the mounting substrate 9.

As described above, the second input matching circuit 42 includes four inductors and one capacitor. Although not shown in the drawing, each of the four inductors and one capacitor is mounted on the first major surface 91 of the mounting substrate 9. In a plan view in the thickness direction D1 of the mounting substrate 9, the outer edge of each of the four inductors and one capacitor has a rectangular shape. The second input matching circuit 42 may include, for example, an internal layer inductor provided in the mounting substrate 9.

As described above, the matching circuit 71 includes one inductor 711 and one capacitor 712. As shown in FIG. 1, each of the one inductor 711 and the one capacitor 712 is mounted on the first major surface 91 of the mounting substrate 9. In a plan view in the thickness direction D1 of the mounting substrate 9, the outer edge of each of the one inductor 711 and the one capacitor 712 has a rectangular shape. The matching circuit 71 may include, for example, an internal layer inductor provided in the mounting substrate 9.

As described above, the matching circuit 72 includes one inductor 721 and one capacitor 722. As shown in FIG. 1, each of the one inductor 721 and the one capacitor 722 is mounted on the first major surface 91 of the mounting substrate 9. In a plan view in the thickness direction D1 of the mounting substrate 9, the outer edge of each of the one inductor 721 and the one capacitor 722 has a rectangular shape. The matching circuit 72 may include, for example, an internal layer inductor provided in the mounting substrate 9.

As described above, the matching circuit 73 includes one inductor 731 and one capacitor 732. As shown in FIG. 1, each of the one inductor 731 and the one capacitor 732 is mounted on the first major surface 91 of the mounting substrate 9. In a plan view in the thickness direction D1 of the mounting substrate 9, the outer edge of each of the one inductor 731 and the one capacitor 732 has a rectangular shape. The matching circuit 73 may include, for example, an internal layer inductor provided in the mounting substrate 9.

As described above, the matching circuit 74 includes one inductor 741 and one capacitor 742. As shown in FIG. 1, each of the one inductor 741 and the one capacitor 742 is mounted on the first major surface 91 of the mounting substrate 9. In a plan view in the thickness direction D1 of the mounting substrate 9, the outer edge of each of the one inductor 741 and the one capacitor 742 has a rectangular shape. The matching circuit 74 may include, for example, an internal layer inductor provided in the mounting substrate 9.

As described above, the matching circuit 75 includes one inductor 751. As shown in FIG. 1, the one inductor 751 is mounted on the first major surface 91 of the mounting substrate 9. In a plan view in the thickness direction D1 of the mounting substrate 9, the outer edge of the one inductor 751 has a rectangular shape. The matching circuit 75 may include, for example, an internal layer inductor provided in the mounting substrate 9.

As described above, the low pass filter 60 includes three inductors 601 to 603 and one capacitor 604. As shown in FIG. 1, each of the three inductors 601 to 603 and the one capacitor 604 is mounted on the first major surface 91 of the mounting substrate 9. The outer edge of each of the three inductors 601 to 603 and the one capacitor 604 has a rectangular shape. A cut-off frequency of the low pass filter 60 is, for example, higher than an upper limit of the first frequency band.

Figure 2:
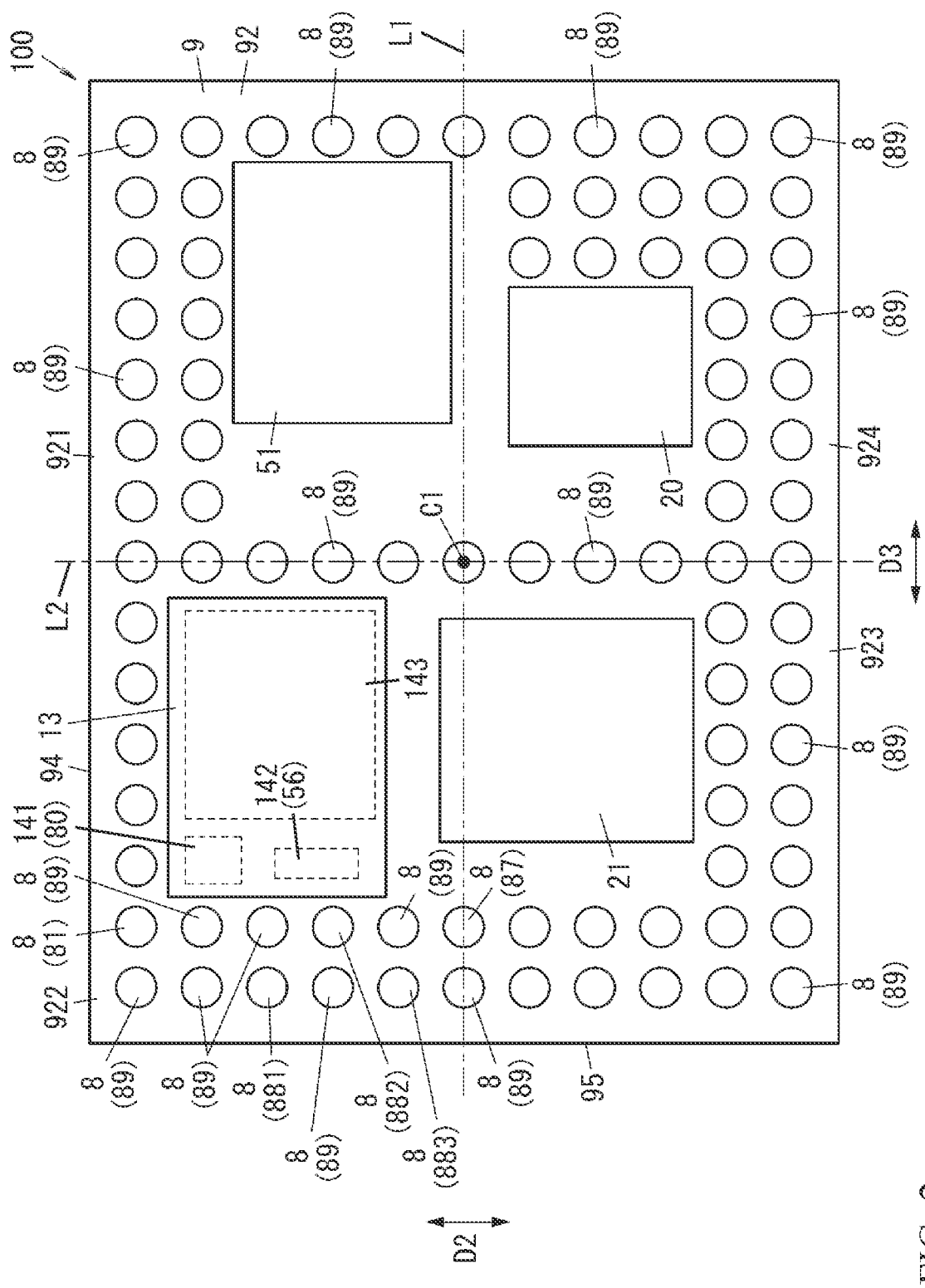
FIG. 2 is a plan view that relates to the radio-frequency module and that shows a second major surface of a mounting substrate and circuit components and a plurality of external connection terminals disposed on the second major surface of the mounting substrate when seen through from the first major surface side of the mounting substrate.

As shown in FIG. 2, the first switch 51 is mounted on the second major surface 92 of the mounting substrate 9. In a plan view in the thickness direction D1 of the mounting substrate 9, the outer edge of the first switch 51 has a rectangular shape. The first switch 51 is, for example, an IC chip that includes a substrate having a first major surface and a second major surface opposite to each other, and a circuit portion formed on the first major surface side of the substrate. The substrate is, for example, a silicon substrate. The circuit portion includes a plurality of FETs as a plurality of switching elements. Each of the plurality of switching elements is not limited to an FET and may be, for example, a bipolar transistor. The first switch 51 is flip-chip mounted on the second major surface 92 of the mounting substrate 9 such that, of the first major surface and the second major surface of the substrate, the first major surface is on the second major surface 92 side of the mounting substrate 9.

As shown in FIG. 2, the controller 20 is mounted on the second major surface 92 of the mounting substrate 9. In a plan view in the thickness direction D1 of the mounting substrate 9, the outer edge of the controller 20 has a rectangular shape. The controller 20 is, for example, an IC chip that includes a substrate having a first major surface and a second major surface opposite to each other, and a circuit portion formed on the first major surface side of the substrate. The substrate is, for example, a silicon substrate. The circuit portion includes a control circuit that controls the first power amplifier 11 and the second power amplifier 12 in accordance with a control signal from the signal processing circuit 301. The controller 20 is flip-chip mounted on the second major surface 92 of the mounting substrate 9 such that, of the first major surface and the second major surface of the substrate, the first major surface is on the second major surface 92 side of the mounting substrate 9. The controller 20 may be, for example, included in one IC chip together with the first switch 51 and the second switch 52.

As shown in FIG. 2, in the radio-frequency module 100 according to the first embodiment, an IC chip 13 that includes a first circuit portion 141, a second circuit portion 142, and a third circuit portion 143 is mounted on the second major surface 92 of the mounting substrate 9. The first circuit portion 141 includes the above-described directional coupler 80. The second circuit portion 142 includes the above-described sixth switch 56. The third circuit portion 143 includes the above-described fifth switch 55 and a control unit (not shown). The layout of the first circuit portion 141, the second circuit portion 142, and the third circuit portion 143 in the IC chip 13 will be described in detail in "(1.3) Layout of Radio-Frequency Module".

Although not shown in the drawing, the second switch 52, the third switch 53, and the fourth switch 54 are mounted on the second major surface 92 of the mounting substrate 9. In a plan view in the thickness direction D1 of the mounting substrate 9, the outer edge of each of the second switch 52, the third switch 53, and the fourth switch 54 has a rectangular shape. Each of the second switch 52, the third switch 53, and the fourth switch 54 is, for example, an IC chip that includes a substrate having a first major surface and a second major surface opposite to each other, and a circuit portion formed on the first major surface side of the substrate. The substrate is, for example, a silicon substrate. The circuit portion includes a plurality of FETs as a plurality of switching elements. Each of the plurality of switching elements is not limited to an FET and may be, for example, a bipolar transistor. Each of the second switch 52, the third switch 53, and the fourth switch 54 is flip-chip mounted on the second major surface 92 of the mounting substrate 9 such that, of the first major surface and the second major surface of the substrate, the first major surface is on the second major surface 92 side of the mounting substrate 9. The third switch 53 and the fourth switch 54 may be, for example, included in one IC chip together with the first low-noise amplifier 21 and the second low-noise amplifier 22. The second switch 52 may be included in one IC chip together with the first switch 51.

As shown in FIG. 2, the plurality of external connection terminals 8 is disposed on the second major surface 92 of the mounting substrate 9. The phrase "the external connection terminals 8 are disposed on the second major surface 92 of the mounting substrate 9" includes not only the structure that the external connection terminals 8 are mechanically connected to the second major surface 92 of the mounting substrate 9 but also the structure that the external connection terminals 8 are electrically connected to (appropriate conductor pattern portions of) the mounting substrate 9. The material of the plurality of external connection terminals 8 is, for example, metal (for example, copper, copper alloy, or the like). Each of the plurality of external connection terminals 8 is a columnar electrode. The columnar electrode is, for example, a cylindrical electrode. The plurality of external connection terminals 8 is bonded to the conductor pattern portions of the mounting substrate 9 by, for example, solder; however, the configuration is not limited thereto. The plurality of external connection terminals 8 may be bonded by using, for example, electrically conductive adhesive (for example, electrically conductive paste) or may be directly bonded.

As described above, the plurality of external connection terminals 8 includes the antenna terminal 81, the plurality of signal input terminals 82, 83, the plurality of signal output terminals 84, 85, the plurality of control terminals 86, the output terminal 87, the plurality of input terminals 881, 882, 883, and the plurality of ground terminals 89. In the radio-frequency module 100 according to the first embodiment, the output terminal 87 and the plurality of input terminals 881, 882, 883 make up a plurality of signal terminals. Therefore, in the radio-frequency module 100 according to the first embodiment, the antenna terminal 81, the plurality of signal input terminals 82, 83, the plurality of signal output terminals 84, 85, the plurality of control terminals 86, and the plurality of ground terminals 89 are not included in the plurality of signal terminals. The plurality of ground terminals 89 is electrically connected to the ground layer of the mounting substrate 9. The ground layer is a circuit ground of the radio-frequency module 100. The plurality of circuit components of the radio-frequency module 100 includes circuit components electrically connected to the ground layer. Hereinafter, when the plurality of input terminals 881, 882, 883 is described separately, the plurality of input terminals 881, 882, 883 may be respectively referred to as the first input terminal 881, the second input terminal 882, and the third input terminal 883.

The radio-frequency module 100 further includes a first resin layer 105. The first resin layer 105 covers each of the circuit components of the first group, mounted on the first major surface 91 of the mounting substrate 9. More specifically, the first resin layer 105 covers the outer peripheral surface of each of the circuit components of the first group. The first resin layer 105 covers the major surface on the opposite side to the mounting substrate 9 side in each of the circuit components of the first group. Of the circuit components of the first group, in the first power amplifier 11, the second power amplifier 12, the first output matching circuit 31, the second output matching circuit 32, the first input matching circuit 41, the second input matching circuit 42, the plurality of matching circuits 71 to 75, and the low pass filter 60, the first resin layer 105 is also disposed between each circuit component and the first major surface 91 of the mounting substrate 9 in the thickness direction D1 of the mounting substrate 9. The first resin layer 105 includes resin (for example, epoxy resin). The first resin layer 105 may include a filler in addition to resin. In the specification, the phrase "the major surface of the circuit component" means a surface of the circuit component on the opposite side to the mounting substrate 9 side. In the specification, the phrase "the outer peripheral surface of the circuit component" means a surface of the circuit component along the thickness direction D1 of the mounting substrate 9 from the outer edge of the major surface of the circuit component.

The radio-frequency module 100 further includes a second resin layer 107 in addition to the first resin layer 105 disposed on the first major surface 91 of the mounting substrate 9. The second resin layer 107 covers the circuit components of the second group, mounted on the second major surface 92 of the mounting substrate 9, and the outer peripheral surface of each of the plurality of external connection terminals 8. The second resin layer 107 includes resin (for example, epoxy resin). The second resin layer 107 may include a filler in addition to resin. The material of the second resin layer 107 may be the same material as the material of the first resin layer 105 or may be a different material.

The second resin layer 107 may be formed so as to expose the major surface on the opposite side to the mounting substrate 9 side in each of the circuit components of the second group mounted on the second major surface 92 of the mounting substrate 9.

The radio-frequency module 100 further includes the electrically conductive layer 106. The electrically conductive layer 106 has an electrical conductivity. The electrically conductive layer 106 is provided for the purpose of electromagnetic shielding between the inside and outside of the radio-frequency module 100. The electrically conductive layer 106 has a multilayer structure such that a plurality of metal layers is laminated; however, the configuration is not limited to the multilayer structure. The electrically conductive layer 106 may have a single metal layer. The metal layer includes one or more types of metals. The electrically conductive layer 106 covers a major surface 151 of the first resin layer 105 on an opposite side to the mounting substrate 9 side, an outer peripheral surface 153 of the first resin layer 105, and an outer peripheral surface 93 of the mounting substrate 9. The electrically conductive layer 106 also covers an outer peripheral surface 173 of the second resin layer 107. The electrically conductive layer 106 is in contact with at least part of the outer peripheral surface of the ground layer of the mounting substrate 9. Thus, the potential of the electrically conductive layer 106 can be set to the same potential as the potential of the ground layer.

(1.3) Layout of Radio-Frequency Module

Next, the layout of the radio-frequency module 100 according to the first embodiment will be described with reference to FIGS. 1 to 3.

As described above, in the radio-frequency module 100 according to the first embodiment, circuit components of the first group are mounted on the first major surface 91 of the mounting substrate 9. In FIG. 1, of the circuit components of the first group, the first power amplifier 11, the first output matching circuit 31, the first input matching circuit 41, the low pass filter 60, the plurality of filters 61 to 65, and the plurality of matching circuits 71 to 75 are shown.

In FIG. 1, the first output matching circuit 31, the first power amplifier 11, and the matching circuit 75 are arranged along a width direction (short-side direction) D2 of the mounting substrate 9. In the first output matching circuit 31, two capacitors 311, 312 and one inductor 313 are arranged along the width direction D2 of the mounting substrate 9. In the radio-frequency module 100 according to the first embodiment, the width direction D2 of the mounting substrate 9 is a first direction.

In FIG. 1, of the plurality of filters 61 to 65, the four filters 61 to 64 are arranged along a longitudinal direction D3 of the mounting substrate 9. In FIG. 1, of the plurality of filters 61 to 65, the two filters 64, 65 are arranged along the width direction D2 of the mounting substrate 9. In the filter 61, the transmitting filter 611 and the receiving filter 612 are arranged along the width direction D2 of the mounting substrate 9. In the filter 62, the transmitting filter 621 and the receiving filter 622 are arranged along the width direction D2 of the mounting substrate 9. In the filter 63, the transmitting filter 631 and the receiving filter 632 are arranged along the width direction D2 of the mounting substrate 9. In the filter 64, the transmitting filter 641 and the receiving filter 642 are arranged along the width direction D2 of the mounting substrate 9. In the filter 65, the transmitting filter 651 and the receiving filter 652 are arranged along the width direction D2 of the mounting substrate 9. In the radio-frequency module 100 according to the first embodiment, the longitudinal direction D3 of the mounting substrate 9 is a second direction.

In FIG. 1, the plurality of matching circuits 71 to 74 are arranged along the longitudinal direction D3 of the mounting substrate 9. In addition, in the matching circuit 71, the inductor 711 and the capacitor 712 are arranged along the width direction D2 of the mounting substrate 9. In the matching circuit 72, the inductor 721 and the capacitor 722 are arranged along the width direction D2 of the mounting substrate 9. In the matching circuit 73, the inductor 731 and the capacitor 732 are arranged along the width direction D2 of the mounting substrate 9. In the matching circuit 74, the inductor 741 and the capacitor 742 are arranged along the width direction D2 of the mounting substrate 9.

In FIG. 1, in the width direction D2 of the mounting substrate 9, the first input matching circuit 41 is disposed on an opposite side to the plurality of matching circuits 71 to 74 side with respect to the plurality of filters 61 to 63. In the first input matching circuit 41, four inductors 411 to 414 and one capacitor 415 are arranged along the longitudinal direction D3 of the mounting substrate 9. In FIG. 1, in the width direction D2 of the mounting substrate 9, the low pass filter 60 is disposed on an opposite side to the plurality of filters 61 to 63 side with respect to the plurality of matching circuits 71 to 74. In the low pass filter 60, three inductors 601 to 603 and one capacitor 604 are arranged along the longitudinal direction D3 of the mounting substrate 9.

As described above, in the radio-frequency module 100 according to the first embodiment, circuit components of the second group are mounted on the second major surface 92 of the mounting substrate 9. FIG. 2 shows the controller 20, the first low-noise amplifier 21, the first switch 51, and the IC chip 13, of the circuit components of the second group. As described above, the IC chip 13 includes the fifth switch 55, the sixth switch 56, the directional coupler 80, and the control unit (not shown).

As described above, in the radio-frequency module 100 according to the first embodiment, the plurality of external connection terminals 8 is disposed on the second major surface 92 of the mounting substrate 9. As described above, the plurality of external connection terminals 8 includes the antenna terminal 81, the two signal input terminals 82, 83 (see FIG. 4), the two signal output terminals 84, 85 (see FIG. 4), the four control terminals 86 (see FIG. 4), the output terminal 87, the three input terminals 881, 882, 883, and the plurality of ground terminals 89.

In the radio-frequency module 100 according to the first embodiment, the mounting substrate 9 is formed in a rectangular shape in a plan view in the thickness direction D1 of the mounting substrate 9. More specifically, the mounting substrate 9 is formed in a rectangular shape of which the size in the longitudinal direction D3 (the size in the right and left direction in FIG. 2) is longer than the size in the width direction D2 (the size in the up and down direction in FIG. 2). As shown in FIGS. 1 and 2, the mounting substrate 9 has a first side 94 and a second side 95 orthogonal to each other. As shown in FIG. 2, the mounting substrate 9 has four regions (a first region 921, a second region 922, a third region 923, and a fourth region 924) divided by a first line L1 and a second line L2. The first line L1 is a straight line that passes through the center C1 of the mounting substrate 9 and that extends along the first side 94 of the mounting substrate 9. The second line L2 is a straight line that passes through the center C1 of the mounting substrate 9 and that extends along the second side 95 of the mounting substrate 9. The phrase "the center C1 of the mounting substrate 9" means a point located right at the center of the mounting substrate 9 in a plan view in the thickness direction D1 of the mounting substrate 9. The word "orthogonal" includes not only a state where the angle between two is strictly 90 degrees but also a state where the angle between two falls within a range including an intersection with which effects are substantially obtained (for example, ±5 degrees). The first switch 51 is disposed in the first region 921. The IC chip 13 is disposed in the second region 922. The first low-noise amplifier 21 is disposed in the third region 923. The controller 20 is disposed in the fourth region 924.

At least one ground terminal 89 is disposed in each of the first region 921, the third region 923, and the fourth region 924. The antenna terminal 81, the output terminal 87, the three input terminals 881, 882, 883, and the plurality of ground terminals 89 are disposed in the second region 922. In FIG. 2, the antenna terminal 81, the second input terminal 882, and the output terminal 87 are disposed in a line (hereinafter, referred to as "first line") along the width direction D2 of the mounting substrate 9. In the first line, the two ground terminals 89 are disposed between the antenna terminal 81 and the second input terminal 882. In the first line, the one ground terminal 89 is disposed between the second input terminal 882 and the output terminal 87. In other words, in the radio-frequency module 100 according to the first embodiment, the antenna terminal 81, the second input terminal 882, and the output terminal 87, arranged in the first line, are not adjacent to each other in the width direction (first direction) D2 of the mounting substrate 9. The phrase "the antenna terminal 81 and the second input terminal 882 are not adjacent to each other in the width direction D2 of the mounting substrate 9" means that, in a plan view in the thickness direction D1 of the mounting substrate 9, another terminal (ground terminal 89) is present between the antenna terminal 81 and the second input terminal 882 in the width direction D2 of the mounting substrate 9 and the antenna terminal 81 and the second input terminal 882 are not adjacent to each other. The phrase "the second input terminal 882 and the output terminal 87 are not adjacent to each other in the width direction D2 of the mounting substrate 9" means that, in a plan view in the thickness direction D1 of the mounting substrate 9, another terminal (ground terminal 89) is present between the second input terminal 882 and the output terminal 87 in the width direction D2 of the mounting substrate 9 and the second input terminal 882 and the output terminal 87 are not adjacent to each other. Each of the antenna terminal 81, the second input terminal 882, and the output terminal 87 is adjacent to the ground terminal 89 in the longitudinal direction D3 of the mounting substrate 9. In other words, each of the antenna terminal 81, the second input terminal 882, and the output terminal 87 is also not adjacent to each other in the longitudinal direction D3 of the mounting substrate 9.

In FIG. 2, the first input terminal 881 and the third input terminal 883 are disposed in a line (hereinafter, referred to as "second line") along the width direction D2 of the mounting substrate 9. In the second line, the one ground terminal 89 is disposed between the first input terminal 881 and the third input terminal 883. In other words, in the radio-frequency module 100 according to the first embodiment, the first input terminal 881 and the third input terminal 883, arranged in the second line, are not adjacent to each other in the width direction D2 of the mounting substrate 9. The phrase "the first input terminal 881 and the third input terminal 883 are not adjacent to each other in the width direction D2 of the mounting substrate 9" means that, in a plan view in the thickness direction D1 of the mounting substrate 9, another terminal (ground terminal 89) is present between the first input terminal 881 and the third input terminal 883 in the width direction D2 of the mounting substrate 9 and the first input terminal 881 and the third input terminal 883 are not adjacent to each other. In the second line, the two ground terminals 89 are disposed on an opposite side to the third input terminal 883 side with respect to the first input terminal 881. In the second line, the one ground terminal 89 is disposed on an opposite side to the first input terminal 881 side with respect to the third input terminal 883. Each of the first input terminal 881 and the third input terminal 883 is adjacent to the ground terminal 89 in the longitudinal direction D3 of the mounting substrate 9. In other words, each of the first input terminal 881 and the third input terminal 883 is also not adjacent to each other in the longitudinal direction D3 of the mounting substrate 9.

As described above, in the radio-frequency module 100 according to the first embodiment, a terminal closest to each of the first input terminal 881, the second input terminal 882, the third input terminal 883, and the output terminal 87 is the ground terminal 89. In other words, the plurality of signal terminals (the input terminals 881 to 883 and the output terminal 87) is disposed so as not to be adjacent to each other in each of the first direction (width direction D2) and the second direction (longitudinal direction D3) that intersect with the thickness direction D1 of the mounting substrate 9. Thus, it is possible to suppress jump of a signal between the terminals. As described above, in the radio-frequency module 100 according to the first embodiment, the output terminal 87 is disposed at a location farthest from the antenna terminal 81 as compared to any of the first input terminal 881, the second input terminal 882, and the third input terminal 883 in the width direction (first direction) D2 of the mounting substrate 9. Thus, it is possible to suppress jump of a signal to be received or transmitted via the antenna terminal 81, to the output terminal 87.

As shown in FIG. 2, in the radio-frequency module 100 according to the first embodiment, the second circuit portion 142 and the third circuit portion 143, included in the IC chip 13, are arranged along the longitudinal direction D3 of the mounting substrate 9. More specifically, the third circuit portion 143 is disposed on an opposite side to the plurality of signal terminals (the input terminals 881 to 883 and the output terminal 87) side with respect to the second circuit portion 142 in the longitudinal direction D3 of the mounting substrate 9. As shown in FIG. 2, in the radio-frequency module 100 according to the first embodiment, the first circuit portion 141 and the second circuit portion 142, included in the IC chip 13, are disposed along the width direction D2 of the mounting substrate 9. In other words, in the radio-frequency module 100 according to the first embodiment, the third circuit portion 143 including the fifth switch 55 is disposed on an opposite side to the plurality of signal terminals side with respect to the first circuit portion 141 including the directional coupler 80 in the longitudinal direction D3 of the mounting substrate 9. Thus, it is possible to suppress jump of a signal between the plurality of signal terminals and the fifth switch 55. As described above, in the radio-frequency module 100 according to the first embodiment, the plurality of signal terminals (the input terminals 881 to 883 and the output terminal 87), the directional coupler 80 (first circuit portion 141), and the fifth switch 55 (third circuit portion 143) are disposed in the same region (second region 922).

Figure 3:
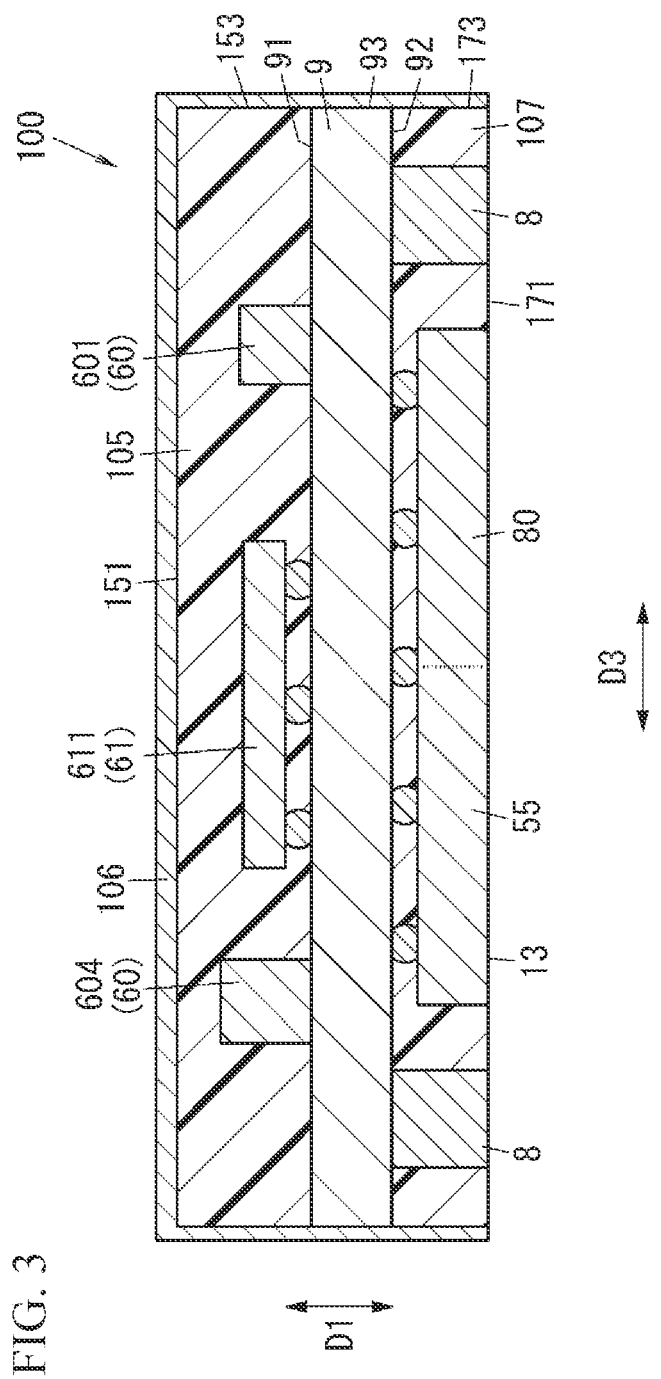
FIG. 3 is a cross-sectional view of the radio-frequency module.

As shown in FIG. 3, in the radio-frequency module 100 according to the first embodiment, the inductor 601 of the low pass filter 60 and the directional coupler 80 included in the IC chip 13 overlap each other in a plan view in the thickness direction D1 of the mounting substrate 9. More specifically, in a plan view in the thickness direction D1 of the mounting substrate 9, part of the inductor 601 and part of the directional coupler 80 overlap each other. In a plan view in the thickness direction D1 of the mounting substrate 9, part of the inductor 601 and the whole of the directional coupler 80 may overlap each other, the whole of the inductor 601 and part of the directional coupler 80 may overlap each other, or the whole of the inductor 601 and the whole of the directional coupler 80 may overlap each other. In short, the phrase "in a plan view in the thickness direction D1 of the mounting substrate 9, the inductor 601 and the directional coupler 80 overlap each other" means that, in a plan view in the thickness direction D1 of the mounting substrate 9, at least part of the inductor 601 and at least part of the directional coupler 80 overlap each other. Thus, it is possible to shorten the wiring length between the inductor 601 and the directional coupler 80, with the result that it is possible to suppress the degradation of the characteristics of the radio-frequency module 100 due to the wiring length.

As shown in FIG. 3, in the radio-frequency module 100 according to the first embodiment, the capacitor 604 of the low pass filter 60 and the fifth switch 55 included in the IC chip 13 overlap each other in a plan view in the thickness direction D1 of the mounting substrate 9. More specifically, in a plan view in the thickness direction D1 of the mounting substrate 9, part of the capacitor 604 and part of the fifth switch 55 overlap each other. In a plan view in the thickness direction D1 of the mounting substrate 9, part of the capacitor 604 and the whole of the fifth switch 55 may overlap each other, the whole of the capacitor 604 and part of the fifth switch 55 may overlap each other, or the whole of the capacitor 604 and the whole of the fifth switch 55 may overlap each other. In short, the phrase "in a plan view in the thickness direction D1 of the mounting substrate 9, the capacitor 604 and the fifth switch 55 overlap each other" means that, in a plan view in the thickness direction D1 of the mounting substrate 9, at least part of the capacitor 604 and at least part of the fifth switch 55 overlap each other. Thus, it is possible to shorten the wiring length between the capacitor 604 and the fifth switch 55, with the result that it is possible to suppress the degradation of the characteristics of the radio-frequency module 100 due to the wiring length.

As shown in FIG. 3, in the radio-frequency module 100 according to the first embodiment, the transmitting filter 611 of the filter 61 and the fifth switch 55 overlap each other in a plan view in the thickness direction D1 of the mounting substrate 9. More specifically, in a plan view in the thickness direction D1 of the mounting substrate 9, part of the transmitting filter 611 and part of the fifth switch 55 overlap each other. In a plan view in the thickness direction D1 of the mounting substrate 9, part of the transmitting filter 611 and the whole of the fifth switch 55 may overlap each other, the whole of the transmitting filter 611 and part of the fifth switch 55 may overlap each other, or the whole of the transmitting filter 611 and the whole of the fifth switch 55 may overlap each other. Thus, it is possible to shorten the wiring length between the transmitting filter 611 and the fifth switch 55, with the result that it is possible to suppress the degradation of the characteristics of the radio-frequency module 100 due to the wiring length.

(1.4) Circuit Configuration of Directional Coupler

Next, the circuit configuration of the directional coupler 80 will be described with reference to FIGS. 4 and 5.

Figure 5:
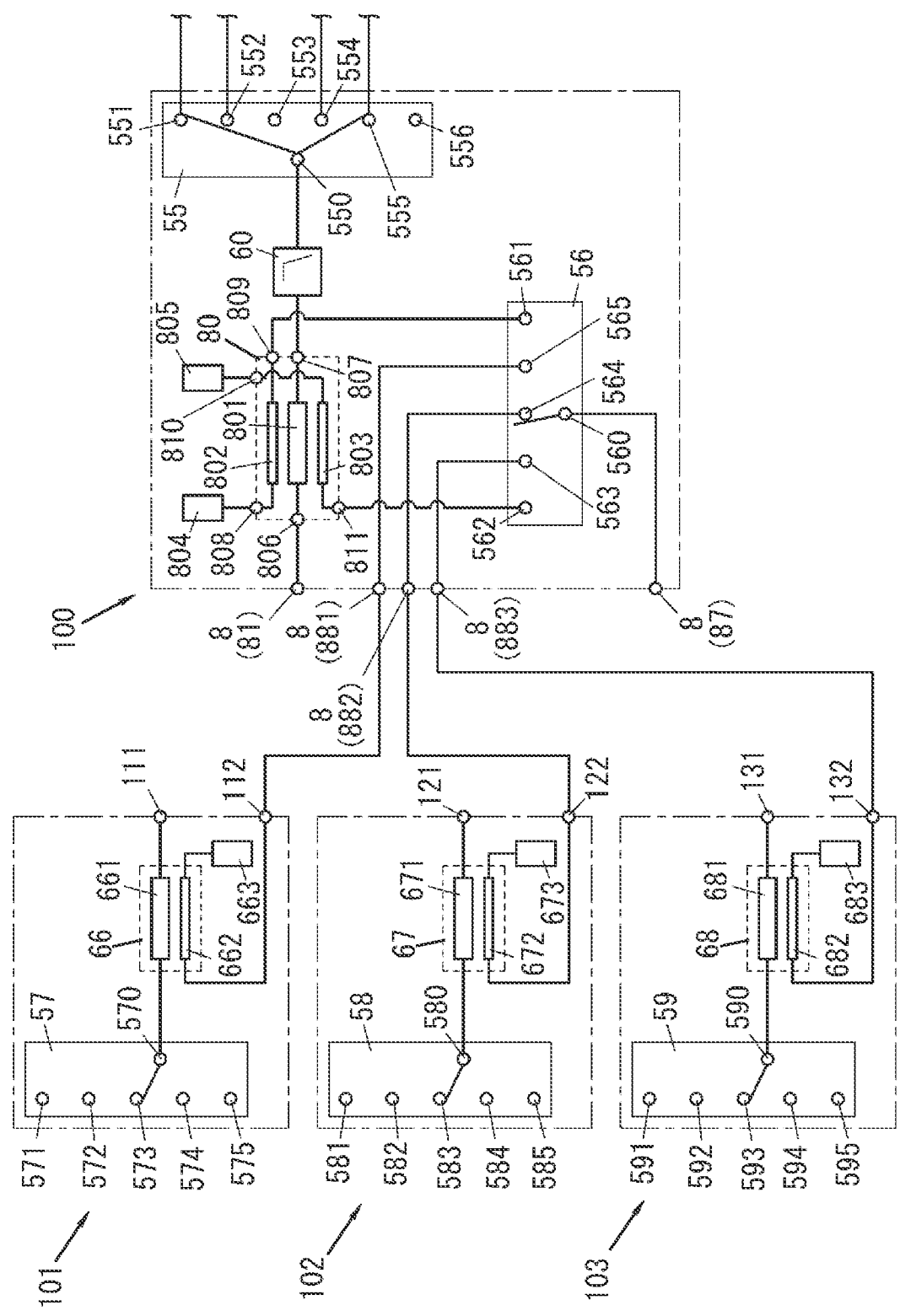
FIG. 5 is a circuit configuration diagram of a relevant part of the radio-frequency module.

As shown in FIGS. 4 and 5, the directional coupler (coupler) 80 has the main line 801 and the plurality of (for example, two) auxiliary lines 802, 803. The directional coupler 80 further has a plurality of (for example, six) terminals 806 to 811. Hereinafter, when the plurality of auxiliary lines 802, 803 is described separately, the plurality of auxiliary line 802, 803 may be respectively referred to as the first auxiliary line 802 and the second auxiliary line 803.

As shown in FIG. 4, the main line 801 is provided in the transmitting path T1 between the antenna terminal 81 and the signal input terminals 82, 83. More specifically, as shown in FIGS. 4 and 5, the main line 801 is provided in the signal path between the antenna terminal 81 and the low pass filter 60 in the transmitting path T1. The "transmitting path T1" is a signal path for propagating a transmitting signal (radio-frequency signal) to be transmitted to the outside via the antenna 310. The transmitting path T1 includes a first transmitting path T11, a second transmitting path T12, a third transmitting path T13, and a fourth transmitting path T14. The first transmitting path T11 is a path that passes through the signal input terminal 82, the first power amplifier 11, the first switch 51, the transmitting filter 611 of the filter 61, the matching circuit 71, the fifth switch 55, the low pass filter 60, the main line 801 of the directional coupler 80, and the antenna terminal 81. The second transmitting path T12 is a path that passes through the signal input terminal 82, the first power amplifier 11, the first switch 51, the transmitting filter 621 of the filter 62, the matching circuit 72, the fifth switch 55, the low pass filter 60, the main line 801 of the directional coupler 80, and the antenna terminal 81. The third transmitting path T13 is a path that passes through the signal input terminal 83, the second power amplifier 12, the second switch 52, the transmitting filter 631 of the filter 63, the matching circuit 73, the fifth switch 55, the low pass filter 60, the main line 801 of the directional coupler 80, and the antenna terminal 81. The fourth transmitting path T14 is a path that passes through the signal input terminal 83, the second power amplifier 12, the second switch 52, the transmitting filter 641 of the filter 64, the matching circuit 74, the fifth switch 55, the low pass filter 60, the main line 801 of the directional coupler 80, and the antenna terminal 81. The main line 801 is connected to the antenna terminal 81 with the terminal 806 interposed therebetween and is connected to the low pass filter 60 with the terminal 807 interposed therebetween.

The first auxiliary line 802 is electromagnetically coupled to the main line 801. The first end of the first auxiliary line 802 is connected to a first termination circuit 804 with the terminal 808 interposed therebetween. The first termination circuit 804 is a circuit for terminating the first auxiliary line 802. The first termination circuit 804 includes, for example, a digital tunable capacitor (not shown). The second end of the first auxiliary line 802 is connected to the selection terminal 561 of the sixth switch 56 with the terminal 809 interposed therebetween.

The second auxiliary line 803 is electromagnetically coupled to the main line 801. The second auxiliary line 803 is disposed on an opposite side to the first auxiliary line 802 side with respect to the main line 801. Thus, isolation between the first auxiliary line 802 and the second auxiliary line 803 is improved. The first end of the second auxiliary line 803 is connected to a second termination circuit 805 with the terminal 810 interposed therebetween. The second termination circuit 805 is a circuit for terminating the second auxiliary line 803. The second termination circuit 805 includes, for example, a digital tunable capacitor (not shown). The second end of the second auxiliary line 803 is connected to the selection terminal 562 of the sixth switch 56 with the terminal 811 interposed therebetween. The directional coupler 80 includes not only the main line 801, the first auxiliary line 802, the second auxiliary line 803, and the terminals 806 to 811 but also a first wiring portion connecting the main line 801 with the terminals 806, 807, a second wiring portion connecting the first auxiliary line 802 with the terminals 808, 809, and a third wiring portion connecting the second auxiliary line 803 with the terminals 810, 811.

The low pass filter 60 is provided in at least one of the transmitting path T1 and the receiving path R1 between the antenna terminal 81 and the signal output terminals 84, 85. In the radio-frequency module 100 according to the first embodiment, the low pass filter 60 is provided in each of the transmitting path T1 and the receiving path R1. More specifically, as shown in FIGS. 4 and 5, the low pass filter 60 is provided in the signal path between the directional coupler 80 and the fifth switch 55 in the transmitting path T1 and the receiving path R1. The "receiving path R1" is a signal path for propagating a receiving signal (radio-frequency signal) to be received from the outside via the antenna 310. The receiving path R1 includes a first receiving path R11, a second receiving path R12, a third receiving path R13, and a fourth receiving path R14. The first receiving path R11 is a path that passes through the antenna terminal 81, the main line 801 of the directional coupler 80, the low pass filter 60, the fifth switch 55, the matching circuit 71, the receiving filter 612 of the filter 61, the third switch 53, the first input matching circuit 41, the first low-noise amplifier 21, and the signal output terminal 84. The second receiving path R12 is a path that passes through the antenna terminal 81, the main line 801 of the directional coupler 80, the low pass filter 60, the fifth switch 55, the matching circuit 72, the receiving filter 622 of the filter 62, the third switch 53, the first input matching circuit 41, the first low-noise amplifier 21, and the signal output terminal 84. The third receiving path R13 is a path that passes through the antenna terminal 81, the main line 801 of the directional coupler 80, the low pass filter 60, the fifth switch 55, the matching circuit 73, the receiving filter 632 of the filter 63, the fourth switch 54, the second input matching circuit 42, the second low-noise amplifier 22, and the signal output terminal 85. The fourth receiving path R14 is a path that passes through the antenna terminal 81, the main line 801 of the directional coupler 80, the low pass filter 60, the fifth switch 55, the matching circuit 74, the receiving filter 642 of the filter 64, the fourth switch 54, the second input matching circuit 42, the second low-noise amplifier 22, and the signal output terminal 85. As described above, the signal path between the antenna terminal 81 and the common terminal 550 of the fifth switch 55 is included in the transmitting path T1 and is also included in the receiving path R1.

As described above, the radio-frequency module 100 according to the first embodiment includes the plurality of input terminals 881, 882, 883. The plurality of input terminals 881, 882, 883 is terminals for inputting detection signals from other radio-frequency modules 101 to 103 to the radio-frequency module 100. More specifically, the first input terminal 881 is a terminal for inputting a detection signal from the radio-frequency module 101. The second input terminal 882 is a terminal for inputting a detection signal from the radio-frequency module 102. The third input terminal 883 is a terminal for inputting a detection signal from the radio-frequency module 103.

As shown in FIG. 5, the radio-frequency module 101 includes a switch 57, a directional coupler 66, an antenna terminal 111, and an output terminal 112. The switch 57 has a common terminal 570 and a plurality of (for example, five) selection terminals 571 to 575. The common terminal 570 is connected to the first end of a main line 661 of the directional coupler 66. The second end of the main line 661 is connected to the antenna terminal 111. The directional coupler 66 has the main line 661 and an auxiliary line 662. The auxiliary line 662 is electromagnetically coupled to the main line 661. The first end of the auxiliary line 662 is connected to a termination circuit 663. The second end of the auxiliary line 662 is connected to the output terminal 112. The auxiliary line 662 propagates (outputs) a detection signal corresponding to a radio-frequency signal that passes through the main line 661. A detection signal that propagates through the auxiliary line 662 is input to the radio-frequency module 100 via the output terminal 112 and the first input terminal 881.

As shown in FIG. 5, the radio-frequency module 102 includes a switch 58, a directional coupler 67, an antenna terminal 121, and an output terminal 122. The switch 58 has a common terminal 580 and a plurality of (for example, five) selection terminals 581 to 585. The common terminal 580 is connected to the first end of a main line 671 of the directional coupler 67. The second end of the main line 671 is connected to the antenna terminal 121. The directional coupler 67 has the main line 671 and an auxiliary line 672. The auxiliary line 672 is electromagnetically coupled to the main line 671. The first end of the auxiliary line 672 is connected to a termination circuit 673. The second end of the auxiliary line 672 is connected to the output terminal 122. The auxiliary line 672 propagates (outputs) a detection signal corresponding to a radio-frequency signal that passes through the main line 671. A detection signal that propagates through the auxiliary line 672 is input to the radio-frequency module 100 via the output terminal 122 and the second input terminal 882.

As shown in FIG. 5, the radio-frequency module 103 includes a switch 59, a directional coupler 68, an antenna terminal 131, and an output terminal 132. The switch 59 has a common terminal 590 and a plurality of (for example, five) selection terminals 591 to 595. The common terminal 590 is connected to the first end of a main line 681 of the directional coupler 68. The second end of the main line 681 is connected to the antenna terminal 131. The directional coupler 68 has the main line 681 and an auxiliary line 682.

The auxiliary line 682 is electromagnetically coupled to the main line 681. The first end of the auxiliary line 682 is connected to a termination circuit 683. The second end of the auxiliary line 682 is connected to the output terminal 132. The auxiliary line 682 propagates (outputs) a detection signal corresponding to a radio-frequency signal that passes through the main line 681. A detection signal that propagates through the auxiliary line 682 is input to the radio-frequency module 100 via the output terminal 132 and the third input terminal 883.

In the radio-frequency module 100 according to the first embodiment, when the common terminal 560 is connected to the selection terminal 561 in the sixth switch 56, a detection signal (first detection signal) that propagates through the first auxiliary line 802 can be output to a detector (not shown) provided outside via the output terminal 87. In the radio-frequency module 100 according to the first embodiment, when the common terminal 560 is connected to the selection terminal 562 in the sixth switch 56, a detection signal (second detection signal) that propagates through the second auxiliary line 803 can be output to the detector via the output terminal 87. In the radio-frequency module 100 according to the first embodiment, when the common terminal 560 is connected to the selection terminal 563 in the sixth switch 56, a detection signal from the radio-frequency module 103 can be output to the detector via the output terminal 87. In the radio-frequency module 100 according to the first embodiment, when the common terminal 560 is connected to the selection terminal 564 in the sixth switch 56, a detection signal from the radio-frequency module 102 can be output to the detector via the output terminal 87. In the radio-frequency module 100 according to the first embodiment, when the common terminal 560 is connected to the selection terminal 565 in the sixth switch 56, a detection signal from the radio-frequency module 101 can be output to the detector via the output terminal 87.

(2) Effects (2.1) Radio-Frequency Module

The radio-frequency module 100 according to the first embodiment includes the antenna terminal 81, the signal input terminals 82, 83, the signal output terminals 84, 85, the mounting substrate 9, the chip inductor 601, and the directional coupler 80. A transmitting signal is input to the signal input terminals 82, 83. A receiving signal is output from the signal output terminals 84, 85. The mounting substrate 9 has the first major surface 91 and the second major surface 92 opposite to each other. The chip inductor 601 is disposed on the first major surface 91 of the mounting substrate 9. The chip inductor 601 is provided in at least one of the transmitting path T1 and the receiving path R1. The transmitting path T1 is a path between the antenna terminal 81 and the signal input terminals 82, 83. The receiving path R1 is a path between the antenna terminal 81 and the signal output terminals 84, 85. The directional coupler 80 is mounted on the second major surface 92 of the mounting substrate 9, and at least part (for example, the main line 801) of the directional coupler 80 is provided in the transmitting path T1.

In the radio-frequency module 100 according to the first embodiment, as described above, the chip inductor 601 is mounted on the first major surface 91 of the mounting substrate 9, and the directional coupler 80 is mounted on the second major surface 92 of the mounting substrate 9. Thus, in comparison with the case where both a chip inductor and a directional coupler are mounted on a first major surface of a mounting substrate, it is possible to reduce the size in a direction that intersects with the thickness direction D1 of the mounting substrate 9. In the radio-frequency module 100 according to the first embodiment, when a ground layer is provided in the mounting substrate 9, isolation between the chip inductor 601 and the directional coupler 80 is further improved. Thus, it is possible to suppress jump of a signal between the chip inductor 601 and the directional coupler 80, with the result that it is possible to suppress a decrease in detection accuracy. In other words, with the radio-frequency module 100 according to the first embodiment, it is possible to reduce the size and to suppress a decrease in detection accuracy.

As described above, in the radio-frequency module 100 according to the first embodiment, the chip inductor 601 and the directional coupler 80 overlap each other in a plan view in the thickness direction D1 of the mounting substrate 9. Thus, it is possible to shorten the wiring length between the chip inductor 601 and the directional coupler 80, with the result that it is possible to suppress the degradation of the characteristics of the radio-frequency module 100 due to the wiring length.

As described above, in the radio-frequency module 100 according to the first embodiment, the first input terminal 881, the second input terminal 882, the third input terminal 883, and the output terminal 87 are not adjacent to each other in each of the width direction D2 and the longitudinal direction D3 of the mounting substrate 9. Thus, isolation between the signal terminals is improved, with the result that jump of a signal between the signal terminals is suppressed. In the radio-frequency module 100 according to the first embodiment, the ground terminal 89 is disposed between the signal terminals, so isolation between the signal terminals is further improved.

As described above, in the radio-frequency module 100 according to the first embodiment, the output terminal 87 is disposed at a location farthest from the antenna terminal 81 in the width direction (first direction) D2 of the mounting substrate 9, of the plurality of signal terminals. Thus, isolation between the antenna terminal 81 and the output terminal 87 is improved, with the result that jump of a signal to be transmitted or received via the antenna terminal 81, to the output terminal 87 is suppressed.

As described above, in the radio-frequency module 100 according to the first embodiment, the plurality of input terminals 881 to 883 and the output terminal 87 are arranged in two lines. Thus, in comparison with the case where the plurality of input terminals and the output terminal are arranged in a line, the wiring length to the sixth switch 56 is shortened, with the result that the degradation of the characteristics of the radio-frequency module 100 is suppressed.

(2.2) Communication Device

The communication device 300 according to the first embodiment includes the above-described radio-frequency module 100 and the signal processing circuit 301. The signal processing circuit 301 is connected to the radio-frequency module 100.

Since the communication device 300 according to the first embodiment includes the radio-frequency module 100, it is possible to reduce the size and to suppress a decrease in detection accuracy.

A plurality of electronic components that make up the signal processing circuit 301 may be mounted on, for example, the above-described circuit board or may be mounted on a circuit board (second circuit board) different from the circuit board (first circuit board) on which the radio-frequency module 100 is mounted.

(3) Modification

Figure 6:
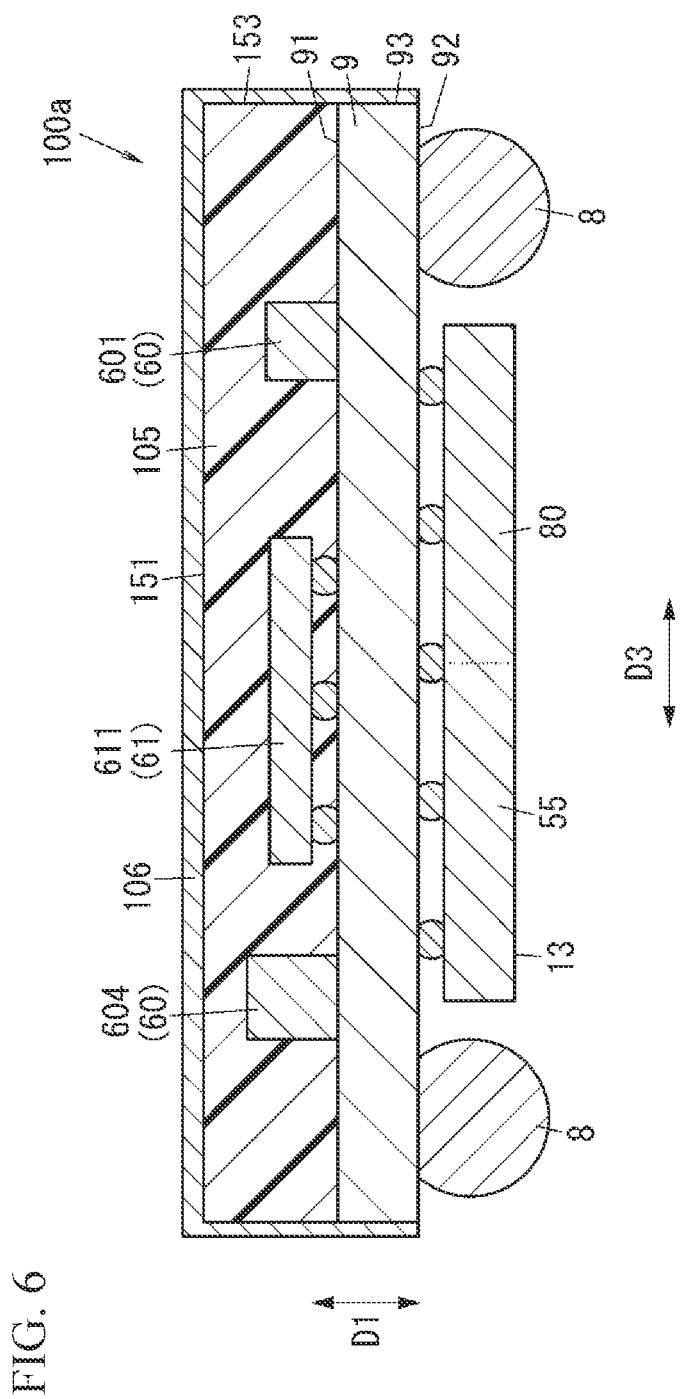
FIG. 6 is a cross-sectional view of a radio-frequency module according to a modification of the first embodiment.

A radio-frequency module 100a according to a modification of the first embodiment will be described with reference to FIG. 6. For the radio-frequency module 100a according to the modification, like reference signs denote component elements similar to those of the radio-frequency module 100 according to the first embodiment, and the description is omitted.

The radio-frequency module 100a according to the modification differs from the radio-frequency module 100 according to the first embodiment in that the plurality of external connection terminals 8 is ball bumps. The radio-frequency module 100a according to the modification differs from the radio-frequency module 100 according to the first embodiment in that the radio-frequency module 100a according to the modification does not include the second resin layer 107 of the radio-frequency module 100 according to the first embodiment. The radio-frequency module 100a according to the modification may include an underfill portion provided between the IC chip 13 mounted on the second major surface 92 of the mounting substrate 9 and the second major surface 92 of the mounting substrate 9.

The material of the ball bump that makes up each of the plurality of external connection terminals 8 is, for example, gold, copper, solder, or the like.

The plurality of external connection terminals 8 may mixedly include the external connection terminals 8 each made up of a ball bump and the external connection terminals 8 each made up of a columnar electrode.

With the radio-frequency module 100a according to the modification, as well as the radio-frequency module 100 according to the first embodiment, it is possible to reduce the size and to suppress a decrease in detection accuracy.

Second Embodiment

Figure 7:
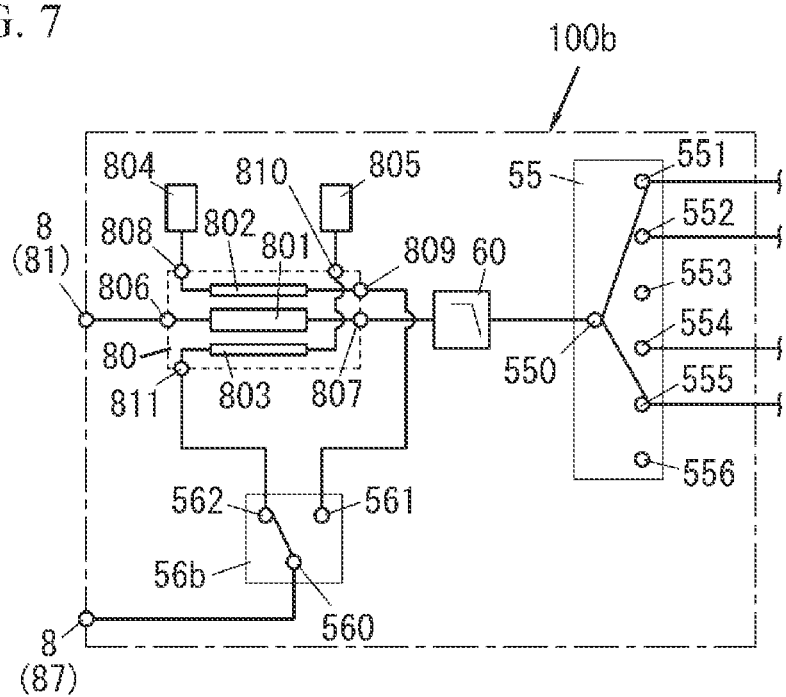
FIG. 7 is a circuit configuration diagram of a relevant part of a radio-frequency module according to a second embodiment.

A radio-frequency module 100b according to a second embodiment will be described with reference to FIG. 7. For the radio-frequency module 100b according to the second embodiment, like reference signs denote component elements similar to those of the radio-frequency module 100 according to the first embodiment, and the description is omitted.

The radio-frequency module 100b according to the second embodiment differs from the radio-frequency module 100 according to the first embodiment in that only detection signals (the first detection signal and the second detection signal) from the directional coupler 80 of the radio-frequency module 100b are output to the detector.

(1) Radio-Frequency Module

The radio-frequency module 100b according to the second embodiment will be described with reference to FIG. 7.

In the radio-frequency module 100b according to the second embodiment, the directional coupler 80 has the main line 801 and the plurality of (for example, two) auxiliary lines 802, 803. The directional coupler 80 further has the plurality of (for example, six) terminals 806 to 811. The main line 801 is provided in the signal path between the antenna terminal 81 and the low pass filter 60 in the transmitting path T1 (see FIG. 4). In other words, the first end of the main line 801 is connected to the antenna terminal 81 with the terminal 806 interposed therebetween, and the second end of the main line 801 is connected to the low pass filter 60 with the terminal 807 interposed therebetween.

The first auxiliary line 802 and the second auxiliary line 803 are electromagnetically coupled to the main line 801. The first end of the first auxiliary line 802 is connected to the first termination circuit 804 with the terminal 808 interposed therebetween, and the second end of the first auxiliary line 802 is connected to the selection terminal 561 of a sixth switch 56b with the terminal 809 interposed therebetween. The first end of the second auxiliary line 803 is connected to the second termination circuit 805 with the terminal 810 interposed therebetween, and the second end of the second auxiliary line 803 is connected to the selection terminal 562 of the sixth switch 56 with the terminal 811 interposed therebetween. The common terminal 560 of the sixth switch 56 is connected to the output terminal 87.

In the radio-frequency module 100b according to the second embodiment, when the common terminal 560 is connected to the selection terminal 561 in the sixth switch 56b, a first detection signal that propagates through the first auxiliary line 802 can be output to a detector (not shown). In the radio-frequency module 100b according to the second embodiment, when the common terminal 560 is connected to the selection terminal 562 in the sixth switch 56b, a second detection signal that propagates through the second auxiliary line 803 can be output to the detector.

(2) Modifications

Figure 8:
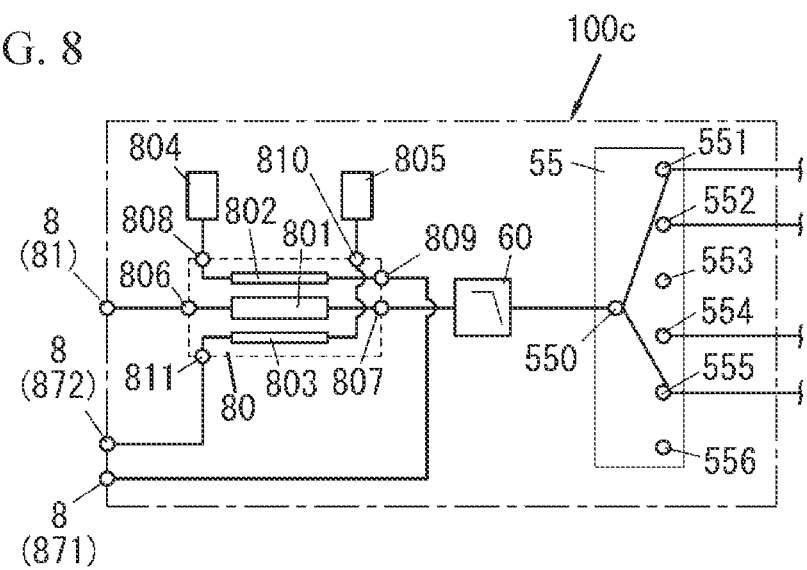
FIG. 8 is a circuit configuration diagram of a relevant part of a radio-frequency module according to a first modification of the second embodiment.
Figure 9:
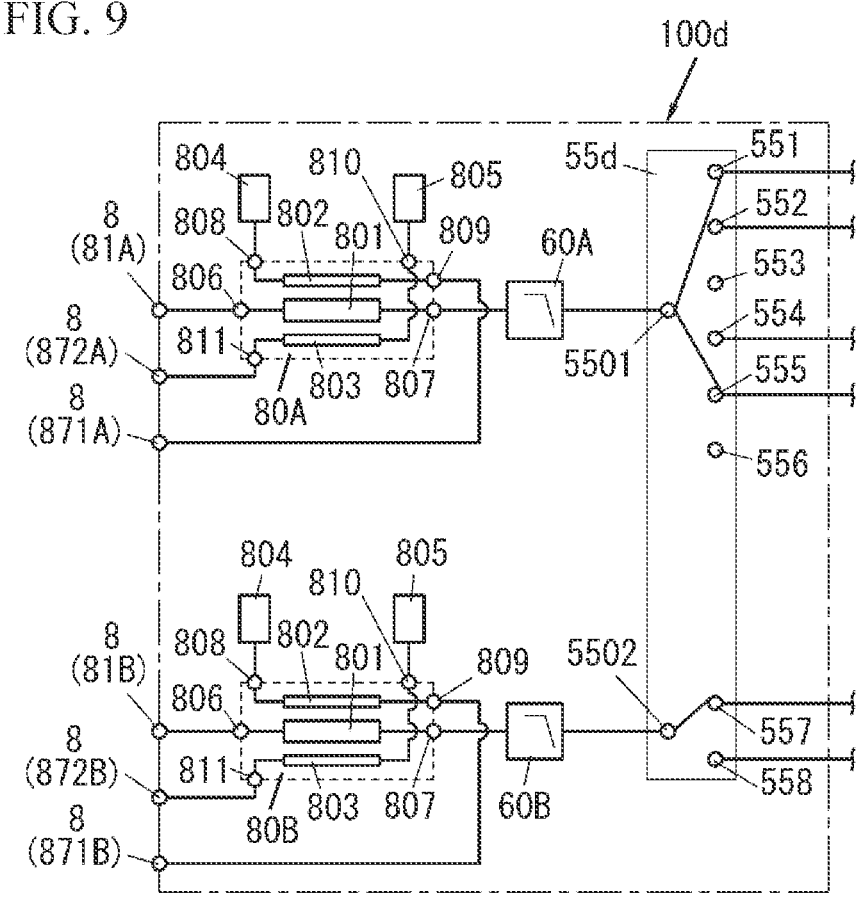
FIG. 9 is a circuit configuration diagram of a relevant part of a radio-frequency module according to a second modification of the second embodiment.

Next, modifications of the second embodiment will be described with reference to FIGS. 8 and 9.

(2.1) First Modification

A radio-frequency module 100c according to a first modification will be described with reference to FIG. 8. For the radio-frequency module 100c according to the first modification, like reference signs denote component elements similar to those of the radio-frequency module 100b according to the second embodiment, and the description is omitted.

The radio-frequency module 100c according to the first modification differs from the radio-frequency module 100b according to the second embodiment in that a first detection signal that propagates through the first auxiliary line 802 and a second detection signal that propagates through the second auxiliary line 803 are respectively output from different output terminals (the first output terminal 871 and the second output terminal 872).

The radio-frequency module 100c according to the first modification includes the first output terminal 871 and the second output terminal 872 as the output terminals. The first output terminal 871 is a terminal for outputting a first detection signal that propagates through the first auxiliary line 802. The second output terminal 872 is a terminal for outputting a second detection signal that propagates through the second auxiliary line 803. In other words, the second end of the first auxiliary line 802 of which the first end is connected to the first termination circuit 804 with the terminal 808 interposed therebetween is connected to the first output terminal 871 with the terminal 809 interposed therebetween. The second end of the second auxiliary line 803 of which the first end is connected to the second termination circuit 805 with the terminal 810 interposed therebetween is connected to the second output terminal 872 with the terminal 811 interposed therebetween.

In the radio-frequency module 100c according to the first modification, a first detection signal that propagates through the first auxiliary line 802 can be output to a detector (not shown) via the first output terminal 871. In the radio-frequency module 100c according to the first modification, a second detection signal that propagates through the second auxiliary line 803 can be output to the detector via the second output terminal 872.

(2.2) Second Modification

A radio-frequency module 100d according to a second modification will be described with reference to FIG. 9. For the radio-frequency module 100d according to the second modification, like reference signs denote component elements similar to those of the radio-frequency module 100b according to the second embodiment, and the description is omitted.

The radio-frequency module 100d according to the second modification differs from the radio-frequency module 100c according to the first modification in that a plurality of directional couplers 80A, 80B is provided.

The radio-frequency module 100d according to the second modification includes the plurality of (for example, two) directional couplers 80A, 80B, a plurality of (for example, two) low pass filters 60A, 60B, and a fifth switch 55d. The radio-frequency module 100d according to the second modification further includes a plurality of (for example, two) antenna terminals 81A, 81B and a plurality of (for example, four) output terminals 871A, 871B, 872A, 872B.

The directional coupler 80A has the main line 801 and the plurality of auxiliary lines 802, 803. The directional coupler 80A further has the plurality of (for example, six) terminals 806 to 811. The main line 801 is provided in the signal path between the antenna terminal 81A and the low pass filter 60A in the transmitting path T1 (see FIG. 4). The first auxiliary line 802 and the second auxiliary line 803 are electromagnetically coupled to the main line 801. The first end of the first auxiliary line 802 is connected to the first termination circuit 804 with the terminal 808 interposed therebetween, and the second end of the first auxiliary line 802 is connected to the first output terminal 871A with the terminal 809 interposed therebetween. The first end of the second auxiliary line 803 is connected to the second termination circuit 805 with the terminal 810 interposed therebetween, and the second end of the second auxiliary line 803 is connected to the second output terminal 872A with the terminal 811 interposed therebetween.

The directional coupler 80B has the main line 801 and the plurality of auxiliary lines 802, 803. The directional coupler 80B further has the plurality of (for example, six) terminals 806 to 811. The main line 801 is provided in the signal path between the antenna terminal 81B and the low pass filter 60B in the transmitting path T1 (see FIG. 4). The first auxiliary line 802 and the second auxiliary line 803 are electromagnetically coupled to the main line 801. The first end of the first auxiliary line 802 is connected to the first termination circuit 804 with the terminal 808 interposed therebetween, and the second end of the first auxiliary line 802 is connected to the first output terminal 871B with the terminal 809 interposed therebetween. The first end of the second auxiliary line 803 is connected to the second termination circuit 805 with the terminal 810 interposed therebetween, and the second end of the second auxiliary line 803 is connected to the second output terminal 872B with the terminal 811 interposed therebetween.

The low pass filter 60A is provided in the signal path between the directional coupler 80A and the fifth switch 55d. More specifically, the low pass filter 60A is provided in the signal path between the main line 801 of the directional coupler 80A and a common terminal 5501 of the fifth switch 55d. The low pass filter 60B is provided in the signal path between the directional coupler 80B and the fifth switch 55d. More specifically, the low pass filter 60B is provided in the signal path between the main line 801 of the directional coupler 80B and a common terminal 5502 of the fifth switch 55d.

The fifth switch 55d has the plurality of (for example, two) common terminals 5501, 5502, the plurality of (for example, six) selection terminals 551 to 556 connectable with the common terminal 5501, and the plurality of (for example, two) selection terminals 557, 558 connectable with the common terminal 5502.

In the radio-frequency module 100d according to the second modification, a first detection signal that propagates through the first auxiliary line 802 of the directional coupler 80A can be output to a detector (not shown) via the first output terminal 871A. In the radio-frequency module 100d according to the second modification, a second detection signal that propagates through the second auxiliary line 803 of the directional coupler 80A can be output to the detector via the second output terminal 872A. In the radio-frequency module 100d according to the second modification, a first detection signal that propagates through the first auxiliary line 802 of the directional coupler 80B can be output to the detector via the first output terminal 871B. In the radio-frequency module 100d according to the second modification, a second detection signal that propagates through the second auxiliary line 803 of the directional coupler 80B can be output to the detector via the second output terminal 872B.

Other Modifications

Each of the above-described first and second embodiments and the like is just one of various embodiments of the present disclosure. The above-described first and second embodiments and the like each may be modified into various forms according to design or the like as long as the object of the present disclosure is achieved. Mutually different component elements of the mutually different embodiments may be combined as needed.

In the radio-frequency modules 100, 100a, 100b, 100c, 100d, the electrically conductive layer 106 is not limited to the case where the electrically conductive layer 106 covers the entire part of the major surface 151 of the first resin layer 105 and may cover at least part of the major surface 151 of the first resin layer 105.

Each of the plurality of transmitting filters 611, 621, 631, 641, 651 and the plurality of receiving filters 612, 622, 632, 642, 652 is not limited to a surface acoustic wave filter and may be, for example, a bulk acoustic wave (BAW) filter. A resonator in the BAW filter is, for example, a film bulk acoustic resonator (FBAR) or a solidly mounted resonator (SMR). The BAW filter has a substrate. The substrate is, for example, a silicon substrate.

Each of the plurality of transmitting filters 611, 621, 631, 641, 651 and the plurality of receiving filters 612, 622, 632, 642, 652 is not limited to a ladder filter and may be, for example, a longitudinally coupled resonator-type surface acoustic wave filter.

The above-described acoustic wave filter is an acoustic wave filter that uses surface acoustic waves or bulk acoustic waves; however, the configuration is not limited thereto. The above-described acoustic wave filter may be, for example, an acoustic wave filter that uses boundary acoustic waves, plate waves, or the like.

The communication device 300 according to the first embodiment may include any one of the radio-frequency modules 100a, 100b, 100c, 100d instead of the radio-frequency module 100.

In the radio-frequency modules 100, 100a, 100b, 100c, 100d, each of the directional couplers 80, 80A, 80B has two auxiliary lines 802, 803; however, the configuration is not limited thereto. Each of the directional couplers 80, 80A, 80B, for example, may have only the first auxiliary line 802 or may have only the second auxiliary line 803.

In the radio-frequency module 100 according to the first embodiment, the plurality of input terminals 881 to 883 and the output terminal 87 are arranged in two lines; however, the configuration is not limited thereto. The plurality of input terminals 881 and the output terminal 87 may be, for example, arranged in three or more lines.

In the radio-frequency module 100 according to the first embodiment, one ground terminal 89 is disposed between the plurality of signal terminals (the input terminals 881 to 883 and the output terminal 87). Alternatively, for example, two or more ground terminals 89 may be disposed between the plurality of signal terminals.

In the radio-frequency modules 100, 100a, 100b, 100c, 100d, the low pass filter 60 is provided between the directional coupler 80 and the fifth switch 55, the low pass filter 60A is provided between the directional coupler 80A and the fifth switch 55d, and the low pass filter 60B is provided between the directional coupler 80B and the fifth switch 55d; however, the configuration is not limited thereto. The low pass filter 60 may be provided between the antenna terminal 81 and the directional coupler 80, the low pass filter 60A may be provided between the antenna terminal 81A and the directional coupler 80A, and the low pass filter 60B may be provided between the antenna terminal 81B and the directional coupler 80B.

In the radio-frequency module 100d, two detection signals from the directional coupler 80A and two detection signals from the directional coupler 80B are configured to be respectively output from different output terminals. Alternatively, for example, one or some of the four detection signals may be configured to be output via a sixth switch. For example, two detection signals output from the directional coupler 80A or the directional coupler 80B may be configured to be output to an output terminal via the sixth switch. For example, one of the detection signals of the directional coupler 80A and one of the detection signals of the directional coupler 80B may be configured to be output to the output terminal via the sixth switch.

In the radio-frequency modules 100, 100a, 100b, 100c, 100d, the chip inductor 601 is an inductor that is a component of each of the low pass filters 60, 60A, 60B; however, the configuration is not limited thereto. The chip inductor 601 may be, for example, an inductor that is a component of a matching circuit provided in the signal path between the antenna terminal 81 and the fifth switch 55, the signal path between the antenna terminal 81A and the fifth switch 55d, or the signal path between the antenna terminal 81B and the fifth switch 55d.

Aspects

The following aspects are disclosed in the specification.

A radio-frequency module (100; 100a to 100d) according to a first aspect includes an antenna terminal (81; 81A, 81B), a signal input terminal (82, 83), a signal output terminal (84, 85), a mounting substrate (9), a chip inductor (601), and a directional coupler (80; 80A, 80B). A transmitting signal is input to the signal input terminal (82, 83). A receiving signal is output from the signal output terminal (84, 85). The mounting substrate (9) has a first major surface (91) and a second major surface (92) opposite to each other. The chip inductor (601) is disposed on the first major surface (91) of the mounting substrate (9). The chip inductor (601) is provided in at least one of a transmitting path (T1) between the antenna terminal (81; 81A, 81B) and the signal input terminal (82, 83) and a receiving path (R1) between the antenna terminal (81; 81A, 81B) and the signal output terminal (84, 85). The directional coupler (80; 80A, 80B) is mounted on the second major surface (92) of the mounting substrate (9), and at least part (main line 801) of the directional coupler (80; 80A, 80B) is provided in the transmitting path (T1).

According to this aspect, it is possible to reduce the size and improve detection accuracy.

In a radio-frequency module (100; 100a to 100d) according to a second aspect, in the first aspect, the chip inductor (601) is a component of a low pass filter (60; 60A, 60B) or a matching circuit, provided in the transmitting path (T1). In a plan view in a thickness direction (D1) of the mounting substrate (9), the chip inductor (601) and the directional coupler (80; 80A, 80B) overlap each other.

According to this aspect, it is possible to shorten the wiring length between the chip inductor (601) and the directional coupler (80; 80A, 80B), with the result that it is possible to suppress the degradation of the characteristics of the radio-frequency module (100; 100a to 100d) due to the wiring length.

A radio-frequency module (100; 100a to 100d) according to a third aspect, in the first or second aspect, further includes an output terminal (87; 871, 872; 871A, 871B, 872A, 872B) that outputs a detection signal from the directional coupler (80; 80A, 80B). The directional coupler (80; 80A, 80B) has a main line (801) and at least one auxiliary line (802, 803). The main line (801) is provided in the transmitting path (T1). The auxiliary line (802, 803) is electromagnetically coupled to the main line (801). The output terminal (87; 871, 872; 871A, 871B, 872A, 872B) is connected to the auxiliary line (802, 803).

According to this aspect, it is possible to output a detection signal from the directional coupler (80; 80A, 80B) to an outside.

A radio-frequency module (100) according to a fourth aspect, in the third aspect, further includes a selecting switch (56). The selecting switch (56) selects at least one of a detection signal output from the directional coupler (80) and a detection signal output from another directional coupler (66 to 68) of another radio-frequency module (101 to 103) and outputs the selected detection signal to the output terminal (87).

According to this aspect, it is possible to output a plurality of detection signals from one output terminal (87).

In a radio-frequency module (100; 100a to 100d) according to a fifth aspect, in the third or fourth aspect, the directional coupler (80; 80A, 80B) has a first auxiliary line (802) and a second auxiliary line (803) as the auxiliary line (802, 803). The first auxiliary line (802) outputs a first detection signal corresponding to a transmitting signal. The second auxiliary line (803) outputs a second detection signal corresponding to a receiving signal.

According to this aspect, it is possible to improve detection accuracy for both a transmitting signal and a receiving signal.

A radio-frequency module (100) according to a sixth aspect, in any one of the third to fifth aspects, further includes a plurality of signal terminals (87, 881 to 883) and a switch (55). The plurality of signal terminals (87, 881 to 883) includes an output terminal (87) and is disposed on the second major surface (92) of the mounting substrate (9). The switch (55) is mounted on the second major surface (92) of the mounting substrate (9) and connected to the antenna terminal (81). The mounting substrate (9) has a rectangular shape in a plan view in a thickness direction (D1) of the mounting substrate (9). The mounting substrate (9) has a first side (94) and a second side (95) orthogonal to each other. Where the mounting substrate (9) is divided into four regions (921 to 924) by a first line (L1) passing through a center (C1) of the mounting substrate (9) and extending along the first side (94) and a second line (L2) passing through the center (C1) of the mounting substrate (9) and extending along the second side (95), the plurality of signal terminals (87, 881 to 883), the directional coupler (80), and the switch (55) are disposed in the same region (922).

According to this aspect, it is possible to shorten the wiring length between the plurality of signal terminals (87, 881 to 883) and the directional coupler (80) and the wiring length between the directional coupler (80) and the switch (55).

In a radio-frequency module (100) according to a seventh aspect, in the sixth aspect, the plurality of signal terminals (87, 881 to 883) is disposed so as not to be adjacent to each other in each of a first direction (D2) and a second direction (D3) that are orthogonal to the thickness direction (D1) of the mounting substrate (9).

According to this aspect, it is possible to improve isolation between the signal terminals, with the result that it is possible to suppress jump of a signal between the signal terminals.

A radio-frequency module (100) according to an eighth aspect, in the seventh aspect, further includes at least one ground terminal (89). The ground terminal (89) is disposed on the second major surface (92) of the mounting substrate (9). The ground terminal (89) is disposed between two signal terminals in the first direction (D2) or the second direction (D3), of the plurality of signal terminals (87, 881 to 883).

According to this aspect, it is possible to further improve isolation between the signal terminals.

In a radio-frequency module (100) according to a ninth aspect, in the seventh or eighth aspect, the antenna terminal (81) is disposed on the second major surface (92) of the mounting substrate (9). The output terminal (87) is disposed at a location farthest from the antenna terminal (81) in the first direction (D2), of the plurality of signal terminals (87, 881 to 883).

According to this aspect, it is possible to improve isolation between the antenna terminal (81) and the output terminal (87), with the result that it is possible to suppress jump of a signal between the antenna terminal (81) and the output terminal (87).

In a radio-frequency module (100) according to a tenth aspect, in any one of the sixth to ninth aspects, the directional coupler (80) and the switch (55) are integrated into a single chip. The switch (55) is disposed on an opposite side to the plurality of signal terminals (87, 881 to 883) side with respect to the directional coupler (80) in a direction that intersects with the thickness direction (D1) of the mounting substrate (9) (for example, a longitudinal direction D3 of the mounting substrate 9).

According to this aspect, it is possible to improve isolation between the plurality of signal terminals (87, 881 to 883) and the switch (55), with the result that it is possible to suppress jump of a signal between the plurality of signal terminals (87, 881 to 883) and the switch (55).

A radio-frequency module (100; 100a to 100d) according to an eleventh aspect, in any one of the first to tenth aspects, further includes external connection terminals (8). The external connection terminals (8) include the antenna terminal (81), the signal input terminal (82, 83), and the signal output terminal (84, 85) and are disposed on the second major surface (92) of the mounting substrate (9).

According to this aspect, the IC chip 13 is allowed to be disposed in a gap between the mounting substrate (9) and a mother substrate or the like to which the external connection terminals (8) are connected.

A communication device (300) according to a twelfth aspect includes the radio-frequency module (100; 100a to 100d) according to any one of the first to eleventh aspects, and a signal processing circuit (301). The signal processing circuit (301) is connected to the radio-frequency module (100; 100a to 100d).

According to this aspect, it is possible to reduce the size and improve detection accuracy.

REFERENCE SIGNS LIST 8 external connection terminal
9 mounting substrate
11 first power amplifier
12 second power amplifier
13 IC chip
20 controller
31 first output matching circuit
32 second output matching circuit
41 first input matching circuit
42 second input matching circuit
51 first switch
52 second switch
53 third switch
54 fourth switch
55, 55d fifth switch
56, 56b sixth switch (selecting switch)
57, 58, 59 switch
60, 60A, 60B low pass filter
61, 62, 63, 64, 65 filter
66, 67, 68 directional coupler
71, 72, 73, 74, 75 matching circuit
76 digital tunable capacitor
77 control power supply
80, 80A, 80B directional coupler
81, 81A, 81B antenna terminal
82, 83 signal input terminal
84, 85 signal output terminal
86 control terminal
87 output terminal
89 ground terminal
91 first major surface
92 second major surface
93 outer peripheral surface
94 first side
95 second side
100, 100a, 100b, 100c, 100d radio-frequency module
101, 102, 103 another radio-frequency module
105 first resin layer
106 electrically conductive layer
107 second resin layer
111, 121, 131 antenna terminal
112, 122, 132 output terminal
151 major surface
153 outer peripheral surface
171 major surface
173 outer peripheral surface
300 communication device
301 signal processing circuit
302 RF signal processing circuit
303 baseband signal processing circuit
310 antenna
311, 312 capacitor
313 inductor
411, 412, 413, 414 inductor
415 capacitor
510 common terminal
511, 512 selection terminal
520 common terminal
521, 522 selection terminal
530 common terminal
531, 532 selection terminal
540 common terminal
541, 542 selection terminal
550 common terminal
551, 552, 553, 554, 555, 556 selection terminal
560 common terminal
561, 562, 563, 564, 565 selection terminal
570 common terminal
571, 572, 573, 574, 575 selection terminal
580 common terminal
581, 582, 583, 584, 585 selection terminal
590 common terminal
591, 592, 593, 594, 595 selection terminal
601, 602, 603 inductor
604 capacitor
611, 621, 631, 641, 651 transmitting filter
612, 622, 632, 642, 652 receiving filter
661, 671, 681 main line
662, 672, 682 auxiliary line
663, 673, 683 termination circuit
711, 721, 731, 741, 751 inductor
712, 722, 732, 742 capacitor
801 main line
802 first auxiliary line
803 second auxiliary line
804 first termination circuit
805 second termination circuit
871, 871A, 871B first output terminal
872, 872A, 872B second output terminal
881 first input terminal
882 second input terminal
883 third input terminal
921 first region
922 second region
923 third region
924 fourth region
C1 center
D1 thickness direction
D2 width direction (first direction)
D3 longitudinal direction (second direction)
L1, L2 straight line

The invention claimed is:

1. A radio-frequency module comprising:
    an antenna terminal;
    a signal input terminal to which a transmitting signal is input;
    a signal output terminal from which a receiving signal is output;
    a mounting substrate having a first major surface and a second major surface opposite to each other in a thickness direction of the mounting substrate;
    a chip inductor mounted on the first major surface of the mounting substrate, and connected in a transmitting path between the antenna terminal and the signal input terminal or in a receiving path between the antenna terminal and the signal output terminal; and
    a directional coupler mounted on the second major surface of the mounting substrate, and at least partly connected in the transmitting path.

2. The radio-frequency module according to claim 1,
    wherein the chip inductor is a component of a low pass filter or a matching circuit, and is connected in the transmitting path, and
    wherein the chip inductor and the directional coupler overlap in a plan view of the mounting substrate.

3. The radio-frequency module according to claim 1, further comprising:
    an output terminal from which a detection signal from the directional coupler is output,
    wherein the directional coupler comprises:
        a main line in the transmitting path, and
        at least one auxiliary line electromagnetically coupled to the main line, and
    wherein the output terminal is connected to the auxiliary line.

4. The radio-frequency module according to claim 3, further comprising:
    a selecting switch configured to select a detection signal output from the directional coupler or a detection signal output from another directional coupler of another radio-frequency module, and to output the selected detection signal to the output terminal.

5. The radio-frequency module according to claim 3, wherein the auxiliary line of the directional coupler comprises:
    a first auxiliary line through which a first detection signal corresponding to the transmitting signal is output, and
    a second auxiliary line through which a second detection signal corresponding to the receiving signal is output.

6. The radio-frequency module according to claim 3, further comprising:
    a plurality of signal terminals on the second major surface of the mounting substrate, the plurality of signal terminals comprising the output terminal; and
    a switch on the second major surface of the mounting substrate, and connected to the antenna terminal,
    wherein the mounting substrate is rectangular in a plan view of the mounting substrate, and
    wherein the plurality of signal terminals, the directional coupler, and the switch are in the same quadrant of the mounting substrate.

7. The radio-frequency module according to claim 6, wherein the plurality of signal terminals are not adjacent to each other in each of a first direction and a second direction that are orthogonal to the thickness direction of the mounting substrate.

8. The radio-frequency module according to claim 7, further comprising:
    at least one ground terminal on the second major surface of the mounting substrate,
    wherein the ground terminal is between two of the plurality of signal terminals in the first direction or the second direction.

9. The radio-frequency module according to claim 7,
    wherein the antenna terminal is on the second major surface of the mounting substrate, and
    wherein, among the plurality of signal terminals, the output terminal is farthest from the antenna terminal in the first direction.

10. The radio-frequency module according to claim 6,
    wherein the directional coupler and the switch are integrated into a single chip, and
    wherein the switch is on an opposite side to a side of the plurality of signal terminals, with respect to the directional coupler in a direction that intersects with a thickness direction of the mounting substrate.

11. The radio-frequency module according to claim 1, further comprising:
    external connection terminals comprising the antenna terminal, the signal input terminal, and the signal output terminal, the external connection terminals being on the second major surface of the mounting substrate.

12. A communication device comprising:
    the radio-frequency module according to claim 1; and
    a signal processing circuit connected to the radio-frequency module.

* * * * *